United States Patent
Mani et al.

[11] Patent Number: 6,008,643
[45] Date of Patent: Dec. 28, 1999

[54] OFFSET REDUCTION AND SEPARATION OF HALL AND PIEZORESISTIVE VOLTAGES THROUGH CURRENT INJECTION

[75] Inventors: Ramesh G. Mani; K. von Kltizing, both of Stuttgart, Germany

[73] Assignee: R.G. Mani ("Mani"), Stuttgart, Germany

[21] Appl. No.: 08/536,321

[22] Filed: Sep. 29, 1995

[30] Foreign Application Priority Data

Aug. 29, 1995 [EP] European Pat. Off. .............. 94115388

[51] Int. Cl.$^6$ .......................... G01R 33/07; H01L 43/02; H03K 3/38
[52] U.S. Cl. ......................... 324/251; 338/32 H; 257/421
[58] Field of Search .................................. 324/251, 235, 324/207.2; 338/324; 257/421, 425, 426, 427; 327/511

[56] References Cited

U.S. PATENT DOCUMENTS

| | | | |
|---|---|---|---|
| 4,025,941 | 5/1977 | Kanda et al. | 357/27 |
| 4,037,150 | 7/1977 | Taranov et al. | |
| 5,614,754 | 3/1997 | Inoue | 257/421 |

FOREIGN PATENT DOCUMENTS 43 08 375   9/1994   Germany .

OTHER PUBLICATIONS

L..J. van der Pauw, A Method of Measuring Specific Resistivity and Hall Effect of Discs of Arbitrary Shape, Philips Research Reports #13, r9 , 1958.
P. Munter, "A Low–offset Spinning–current Hall Plate", Sensors and Actuators, Mar. 1990, No. 1/3, Lausanne, Ch, pp. 743–746.
R.G. Mani et al., "Temperature–insensitive offset reduction in a Hall effect device", Amer. Inst. of Physics, 1994, pp. 3121–3123.

*Primary Examiner*—Walter E. Snow
*Attorney, Agent, or Firm*—Helfgott & Karas, P.C.

[57] ABSTRACT

A multi-current technique for offset reduction in Hall elements is extended in order to separate a piezoresistive voltage, from a Hall voltage, in similar Hall and piezoresistive devices based on a semiconductor such as, for example, Silicon. In a special embodiment, this offset compensation method expoilts directional averaging using biaxial, quadruple current injection from four electrically separate current sources, in order to obtain in-situ cancellation of the off-diagonal piezoresistive voltage that is generated across Hall voltage contacts upon the application of simple shear stress. The technique indicates the possibility of Si-based Hall elements with field-equivalent offsets well below 1milliTesla, even in devices based on (001) Silicon with current injection in the [110] type directions. Simple methods for realizing multiple sources are also discussed, some of which are based on photovoltaic effects.

23 Claims, 23 Drawing Sheets

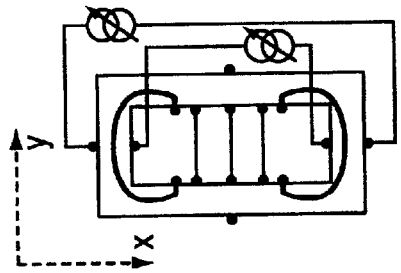
FIG. 4(d)
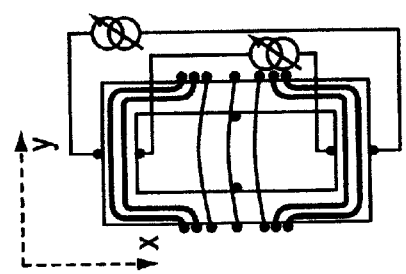
FIG. 4(c)
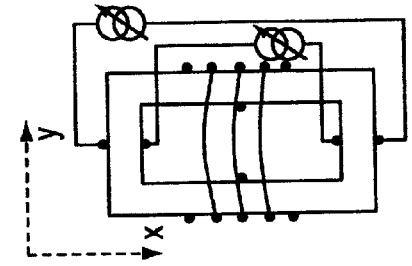
FIG. 4(b)
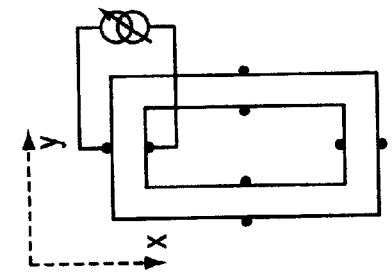
FIG. 4(a)
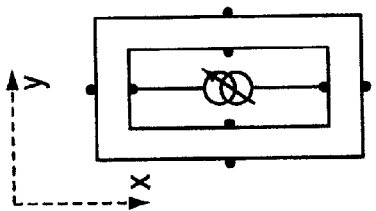
FIG. 4(h)
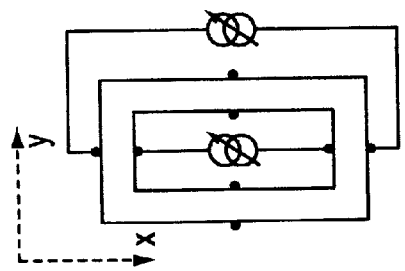
FIG. 4(g)
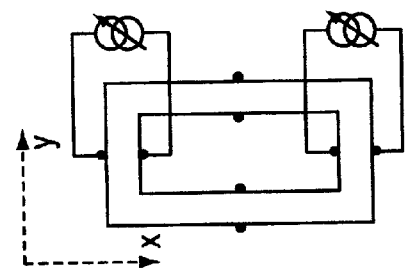
FIG. 4(f)
FIG. 4(e)

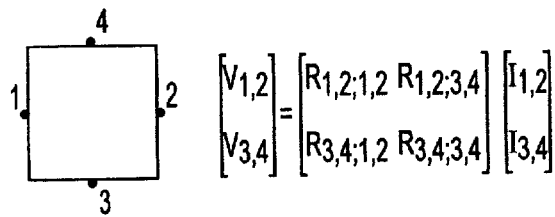

SYMMETRIC TENSOR: $R_{3,4;1,2} = R_{1,2;3,4} = f(S)$ (i) $\begin{bmatrix} I_{1,2} \\ I_{3,4} \end{bmatrix} = \begin{bmatrix} I \\ 0 \end{bmatrix}$; $V_{1,2} = IR_{1,2;1,2}$
$V_{3,4} = I\,f(S)$ $(f(S) > 0)$ (ii) $\begin{bmatrix} I_{1,2} \\ I_{3,4} \end{bmatrix} = \begin{bmatrix} 0 \\ I \end{bmatrix}$; $V_{3,4} = IR_{3,4;3,4}$
$V_{1,2} = I\,f(S)$ HALL EFFECT: $g(B) = \alpha B$
OFF-DIAGONAL PIEZORESISTIVE EFFECT: $f(S) = \beta S$

FIG. 5(a)

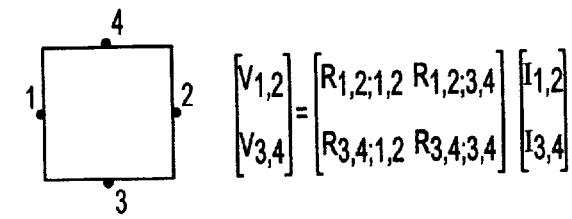

ANTISYMMETRIC TENSOR: $R_{3,4;1,2} = -R_{1,2;3,4} = g(B)$ (i) $\begin{bmatrix} I_{1,2} \\ I_{3,4} \end{bmatrix} = \begin{bmatrix} I \\ 0 \end{bmatrix}$; $V_{1,2} = IR_{1,2;1,2}$
$V_{3,4} = I\,g(B)$ $(g(B) > 0)$ (ii) $\begin{bmatrix} I_{1,2} \\ I_{3,4} \end{bmatrix} = \begin{bmatrix} 0 \\ I \end{bmatrix}$; $V_{3,4} = IR_{3,4;3,4}$
$V_{1,2} = -I\,g(B)$ HALL EFFECT: $g(B) = \alpha B$
OFF-DIAGONAL PIEZORESISTIVE EFFECT: $f(S) = \beta S$

FIG. 5(b)

MIXED TENSOR:

$$\begin{bmatrix} R_{1,2;1,2} & R_{1,2;3,4} \\ R_{3,4;1,2} & R_{3,4;3,4} \end{bmatrix} = \begin{bmatrix} R_{1,2;1,2} & f(S) - g(B) \\ f(S) + g(B) & R_{3,4;3,4} \end{bmatrix}$$

HALL EFFECT : $g(B) = \alpha B$

OFF-DIAGONAL PIEZORESISTIVE EFFECT: $f(S) = \beta S$

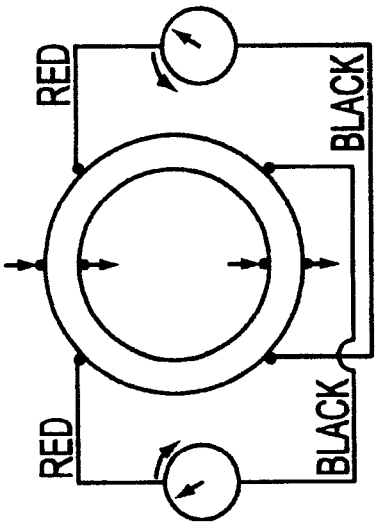
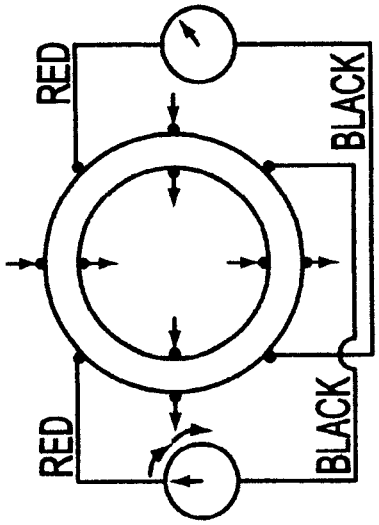
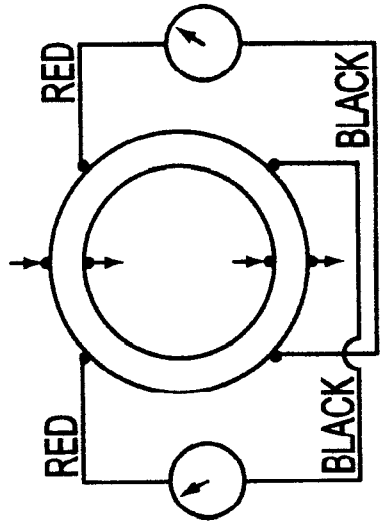
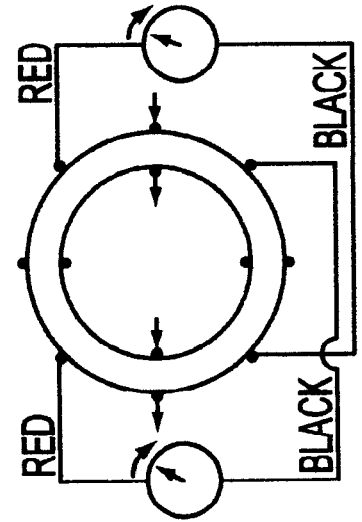
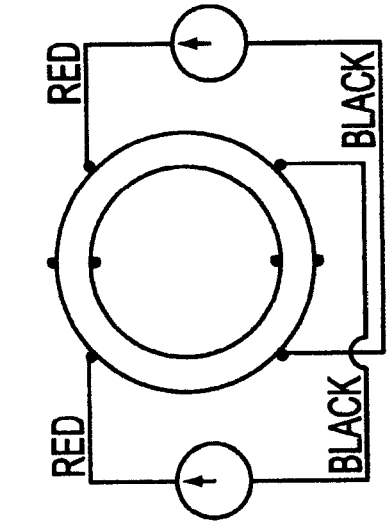
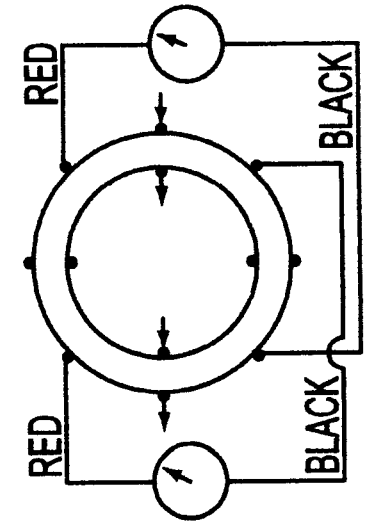

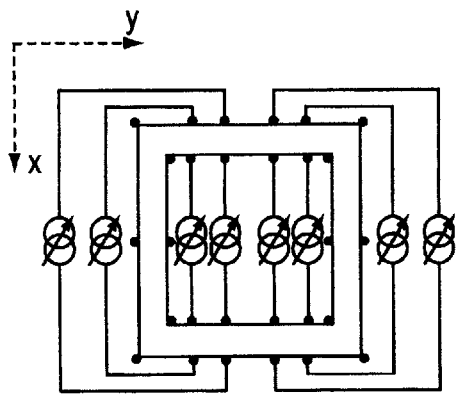
FIG. 14(a)
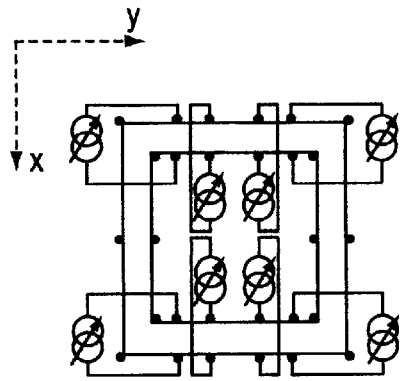
FIG. 14(c)
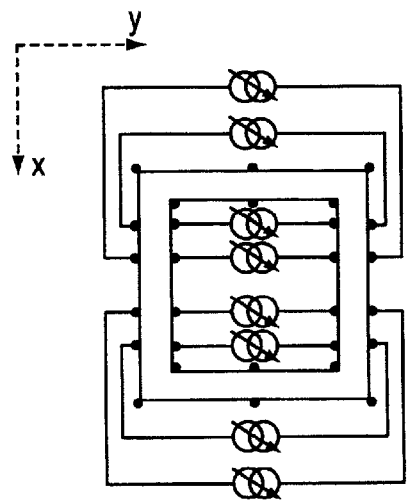
FIG. 14(b)
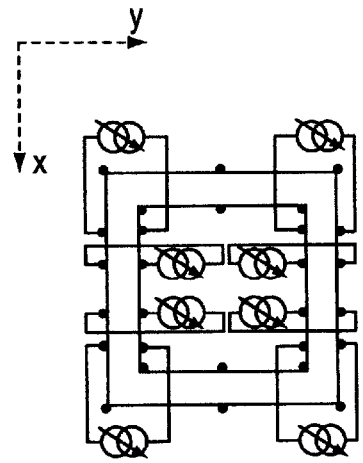
FIG. 14(d)
FIG. 14(e)
= (a) + (b)
FIG. 14(f)
= (c) + (d)
FIG. 14(g)
= (b) + (c)
FIG. 14(h)
= (a) + (d)

OFFSET REDUCTION AND SEPARATION OF HALL AND PIEZORESISTIVE VOLTAGES THROUGH CURRENT INJECTION

BACKGROUND OF THE INVENTION

1. Field of the Invention

The present invention relates to Hall-effect and piezoresistive devices having striplike or platelike shape.

2. Description of the Related Art

Hall effect and certain piezoresistive devices rely upon the development ("off-diagonal") voltages perpendicular to the current due the application of a magnetic field and stress, respectively. These "off-diagonal" voltages are typically generated and measured in a four terminal (Hall plate) configuration, where a pair of contacts serves to inject the current while a second pair of contacts is used to read out the voltage developed across the device. Material inhomogeneities and mask imperfections inevitably lead to effective contact misalignments in such Hall and piezoresistive elements manufactured by photolithography, which leads to an offset voltage across the voltage contacts at null magnetic field in the Hall sensor, and at null shear stress in the piezoresistive element. This misalignment offset influences sensor performance because it is the "signal to offset" that limits sensitivity in the low magnetic field/weak stress limit, especially when the offset changes with the environment. Further complications occur when the magnetic field sensing element exhibits sensitivity to stress, and the stress sensor exhibits sensitivity to the magnetic field. Then, the magnetic field sensor tends to show an additional stress dependent voltage-offset, just as the stress sensor exhibits an additional magnetic field dependent term in the offset voltage. Under such conditions, it becomes useful to identify a technique that can both reduce the misalignment offset, and simultaneously separate the (antisymmetric off-diagonal) Hall voltage from the (symmetric off-diagonal) piezoresistive voltage, or help cancel one of the components across the relevant contacts, such that the sensor signal reflects only the desired effects.

Silicon (Si) devices that respond to external stimuli are especially attractive because this system is conducive to the development of "smart sensors" which include on-chip signal conditioning, amplification, and logic so that the output is directly compatible with microprocessor based controllers used in electronic automation systems. The widespread availability and advanced state of Si IC technology offers, in addition, the possibility of lowcost large-scale production which, in turn, insures increased utilization of such sensors in relatively common applications. An improved magnetic sensor based on Si appears especially useful because magnetic sensors have already appeared as position detectors and contactless switches in applications ranging from electric motors to soft-drink machines and automobiles—applications where better performance would aid in reducing manufacturing tolerances elsewhere. One also feels that a high performance magnetic sensor—one which is sufficiently sensitive to detect variations in the Earth's magnetic field—would prove to be a useful component in the electronic navigation and guidance systems of future automobiles. Analogously, improved piezoresistive devices based on Silicon might find a greater role in applications such as servo-driven automobile steering systems, throttle valve position,- acceleration,- and pressure-sensing.

Magnetic sensors based on the Hall effect combine the advantage of simplicity with linearity even at low magnetic fields. Yet, the relatively low mobility in n-Si, and its piezoresistive character, have combined to reduce the impact of the Si-Hall sensor by limiting its reliability even at the 5–100 mT magnetic fields encountered in typical position sensing applications. The reduced mobility contributes to the problem by increasing the diagonal voltage drop ($V_{xx}$) for a given (off-diagonal) Hall voltage ($V_H$); misalignments in the Hall voltage contacts compound the problem by picking up a fraction of the diagonal voltage and this can become comparable to the Hall effect, producing small 'signal-to-offset' at low magnetic fields. The piezoresistive character of Si contributes to the problem by allowing the generation of signals across the Hall voltage contacts, comparable in magnitude to $V_H$, upon the application of relatively small shear stresses on the sensor. Although one might partially succeed in decoupling the sensor from external stresses in certain simple situations, the misalignment offset and the piezoresistive offset together become overwhelming in the especially hostile environments that make up most applications.

Recently, the possibility of generating a Hall effect under null (net) current has been demonstrated in GaAs-based devices, and the usefulness of this approach in compensating the misalignment offset observed in Hall sensors, independent of temperature, has been pointed out. An advantage of these double ("anti Hall bar within a Hall bar"),- and multiple,- boundary Hall effect devices, so far as offset reduction is concerned, is that it is possible to realize a vanishing current density in the vicinity of the voltage contacts, which increases insensitivity to effective voltage contact misalignments. An attempt to extend this technique to Si showed that although the misalignment offset was reduced by this technique, as expected, another contribution to the offset, an off-diagonal piezoresistive voltage in the absence of a magnetic field originating from the existence of shear stress, became substantial as compared to the Hall effect at low magnetic fields (B<50 mT) for certain "high piezo" alignments within the crystal. It was noted that this off-diagonal piezoresistive voltage behaved in many respects as the Hall effect and then it became apparent that the techniques and geometries developed for misalignment offset voltage compensation in Hall effect devices could be utilized to fabricate improved sensitivity piezoresisitive devices as well. Thus, the utility of simultaneously reducing both the misalignment-offset, and separating the (antisymmetric off-diagonal) Hall voltage from the (symmetric off-diagonal) piezoresistive voltage, or cancelling insitu one of the components, also became evident.

SUMMARY OF THE INVENTION

Here, we propose a series of solutions which help achieve desired characteristics in piezoresistive and Hall effect devices fabricated not only in Silicon but also in other piezoresistive and Hall conductors as well. (Our emphasis here on Silicon reflects only the fact that it is a widely used semiconductor). We begin by identifying preferred alignments for orienting structures in Silicon, based on principles that may be followed in other systems as well, that help obtain a large or small (shear) piezoresistive response. We show how to align dual boundary, uniaxial current injection devices with respect to the crystal and, further, we examine some embodiments which include biaxial double injection in order to realize directional averaging and take advantage of the dissimilar symmetry of the resistance tensor for the Hall and (shear) piezoresistive effects. The biaxial, double-current injection technique is then compounded in order to obtain a biaxial, quadruple current injection configuration which helps realize, in some special embodiments, a minimal misalignment offset and separation of the piezoresistive and Hall components onto different contact pairs within the same sensor. Finally, the complications originating from the multiplicity of current/voltage sources in such configurations are ameliorated by identifying "a simple supply," which exploits the photovoltaic effect. (It is, perhaps, worth noting that other electronic implementations for a supply that may be found in the literature may be used just as well). The theme here is that photovoltaic devices based on p-n junctions are compatible with Silicon IC technology, and p-n junctions, which constitute a simple photocurrent generator under illumination, might be (although it need not be) readily integrated onto the Silicon sensor. Further, the photon source for an array of current/voltage supplies can be something as readily available as a light emitting diode, whose output may be chopped/modulated at a relatively high frequency in order to separate (in frequency) the sensor signal from other spurious (low frequency) contributions to the offset such as that originating from the thermoelectric effect. Experimental studies of such embodiments indicate the possibility of ((001) Si) magnetic field sensors with field equivalent offsets below 1milliTesla even with the current in the [110] directions, i.e., a "high piezo." orientation.

BRIEF DESCRIPTION OF THE DRAWING

In the drawings:

FIG. 4 shows different embodiments of an "anti Hall-bar within a Hall bar" configuration;

FIGS. 9–11 illustrate the operation of a biaxial quadruple injection device;

FIG. 14 shows an uniaxial eight-fold injection configuration;

DESCRIPTION OF THE PREFERRED EMBODIMENTS

For the measurements shown here, planar doubly connected devices were realized on oriented p-type substrates. An n-epilayer in the shape of a doubly connected frame served as the electrical channel, and small-sized $n^+$ regions, located either outside the exterior boundary or inside the interior boundary, provided electrical access to the conducting layer. The sensor chip was mounted on commercially available dual in line packages (DIP) using an epoxy, and shear stress was coupled to the device by torquing the DIP package as it was held in the mount (See FIG. 2, top). Current sources based on FIG. 1 were used in the experiments and, for orientation dependent studies, the devices were aligned along the "high piezo." and the "low piezo." (see FIG. 3) directions.

Figure 2:
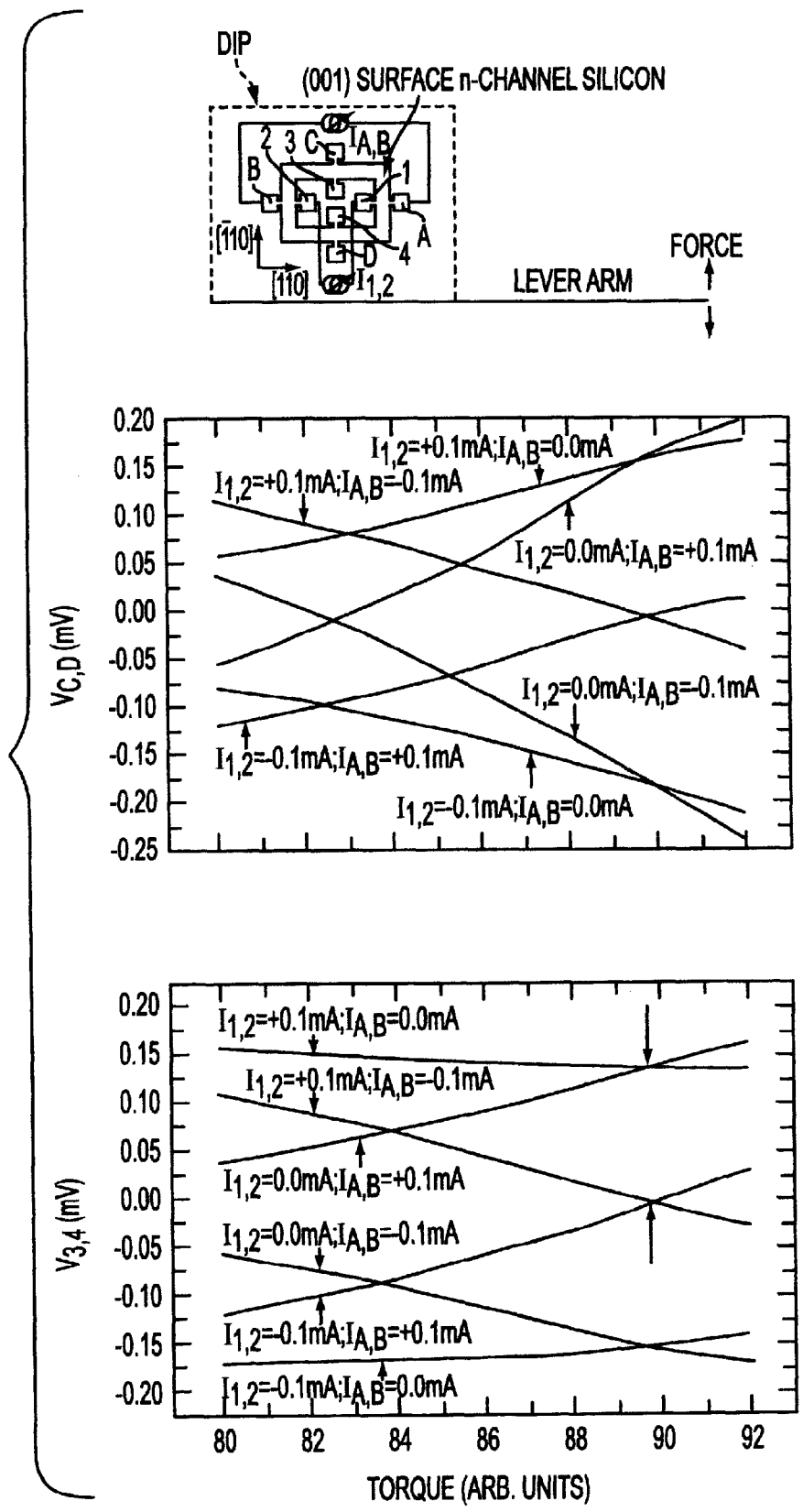
FIG. 2 is a diagram of an "anti Hall-bar within a Hall bar" configuration.

We begin by examining the characteristics observed in a uniaxial, double injection configuration based on the rectangular annulus (see FIG. 2). Here the long axis of the frame is oriented along the [110] direction on the (001) surface of the Si crystal. These data reveal that an off-diagonal piezo-voltage appears across the voltage contacts (C,D) and (3,4), even in the absence of a magnetic field, upon the application of shear stress (torque) on the device. This is due to the existence of components in the piezoresistive tensor which couple shear to the off-diagonal resistivity. Here, the observed effect is similar to the Hall effect in the sense that the influence of the shear stress is analogous to the role of the magnetic field in the Hall effect.

The signals measured across the interior ($V_{3,4}$) and exterior ($V_{C,D}$) Hall voltage contacts in the absence of a magnetic field are plotted in FIG. 2 as a function of the applied torque. Although the signals are shown for both the compensated ($I_{1,2}=-I_{A,B}$) and uncompensated configurations, we begin by examining the compensated configuration because this condition has been shown to minimize the misalignment offset in our previous work. Here, in Si, it is observed that the offset under the ($I_{1,2}=-I_{A,B}$) condition varies linearly with the torque (shear) on the sample mount as one might expect of a piezoresistive effect. A noteworthy feature here is that the curves corresponding to ($I_{1,2}=+0.1$ mA, $I_{A,B}=-0.1$ mA) and ($I_{1,2}=-0.1$ mA, $I_{A,B}=+0.1$ mA) intersect where $V_{3,4}$ and $V_{C,D}$ essentially vanish, which suggests that the offset is minimal, when there is no current flow in the vicinity of the Hall contacts and, concurrently, the shear stress vanishes. The curves corresponding to the uncompensated configuration (($I_{1,2}=-0$ mA, $I_{A,B}=+0.1$ mA) or ($I_{1,2}=+0.1$ mA, $I_{A,B}=-0$ mA)) exhibit the misalignment offset contribution, under the same vanishing stress conditions. Thus, the result confirms that current compensation by uniaxial, double current injection serves to reduce the misalignment offset.

The sensitivity of the offset to the stress observed in FIG. 2 indicates, however, that uniaxial current compensation may not be a sufficient solution in Si because stress built into the device, upon packaging for example, could effectively place the offset response of the device in an uncontrolled state. In order to control this problem, we examine optimal orientations for uniaxial current injection configurations in Silicon (see FIG. 3), based on a study of the piezoresistance coefficients of this crystal. For simplicity, we have considered orientations which minimize ("Low piezo.") or maximize ("High piezo.") the shear response only. Of course, one might fabricate all possible embodiments in the unoriented configuration, and one may also use other criteria, such as the orientation for minimization or maximization of the piezo-Hall response, or even a combination of principles based on a study of the physical properties of the semiconductor in question, in order to determine the optimal orientation for possible embodiments.

FIG. 3 identifies the alignment of the device geometry with respect to the crystallographic axis for n- and p-channel Silicon with the normal (001) {(a) and (b)}, (011) {(c) and (d)}, and (111) {(e)}. In (a)–(f), (i) identifies the orientation for high shear piezoresistive response, which one might select if one desires to fabricate, for example, a piezoresistive sensor. On the other hand, (ii) shows the orientation for low piezoresistive response that one may be choosen if one is interested in minimizing this component (as, for example, in a Hall effect sensor). We illustrate the use of this chart by referring to the frame shaped specimens of FIG. 4, and consider the case where we wish to realize the low piezoresistive orientation in (001) n-channel Silicon— this corresponds to FIG. 3 (a) (ii). Thus, on the appropriate (001) surface Silicon crystal, we mark the desired [100] and [010] directions, and we place a suitably scaled embodiment from FIG. 4 atop the crystal and orient the "alignment marks" (see FIG. 4), with the x-axis parallel to the [100] direction, and the y-axis along the [010] direction, and then transfer the embodiment onto the crystal. Errors of the order of 15 degrees in the alignment of the embodiment with respect to the crystallographic axis may be tolerated in this procedure, and one may also fabricate the geometries in the unoriented crystal or polycrystal or film, if so desired. Such dashed axis or "alignment marks" appear in figures throughout this work and they serve to guide the orientation of the embodiments with respect to crystallographic axis.

As indicated above, the piezoresistive contribution to the offset in a Hall effect device, for example, might be reduced by aligning the embodiment along the "low piezo." orientation, in uniaxial current injection configurations. There occur situations where one seeks special characteristics in the sensor which cannot be obtained using this simple procedure. For example, if one wishes to fabricate a device which is sensitive to shear but insensitive to the magnetic field, or vice versa, then it is useful to investigate more complicated configurations which involve biaxial injection. In order to help understand device performance under such conditions, we have illustrated the behavior of the electrical response in systems characterized by a symmetric and antisymmetric resistance tensor, in FIG. 5. Although one might identify the antisymmetric off-diagonal component in the tensor with the Hall effect and the symmetric off-diagonal component with the shear piezoresistive effect, the underlying physical effects need not be restricted to these examples. Any other effect which may be represented in such a form would do as well, and the techniques and geometries developed here would remain applicable. The point conveyed by this figure is that although the symmetric and antisymmetric tensors both exhibit the same polarity in the off-diagonal voltage when $I_{1,2}=I$, (see FIG. 5(a)(i) and FIG. 5(b)(i)), they show opposite polarities when $I_{3,4}=I$ (see FIG. 5(a)(ii) and FIG. 5(b)(ii)). Thus, there exists some possibility of decoupling the symmetric and antisymmetric contributions by injecting several currents (from several sources) into a single Hall or piezoresisitive or any "off-diagonal voltage" based element, with a finite angle between the injection directions. Some special embodiments of biaxial injection are exhibited in doubly connected (FIG. 6) and multiply connected (FIG. 7) configurations. Here, it is worth noting that the size and the shape of the doubly and multiply connected specimens could assume a large number of variations, each boundary could have an arbitrary number of contacts, and the angle between current vectors could range from special values such as 90 degrees (e.g., FIG. 6(b)), and 45 degrees (e.g., FIG. 6(d)) to any arbitrary value.

Figure 8A:
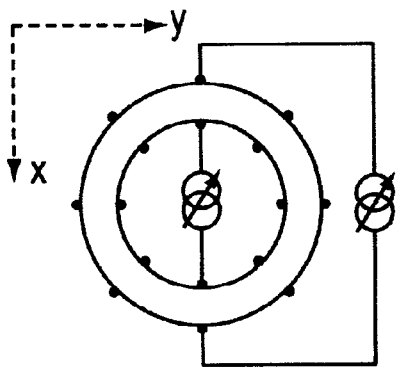
FIG. 8 illustrates producing a dual axis quadruple injection device.
Figure 8B:
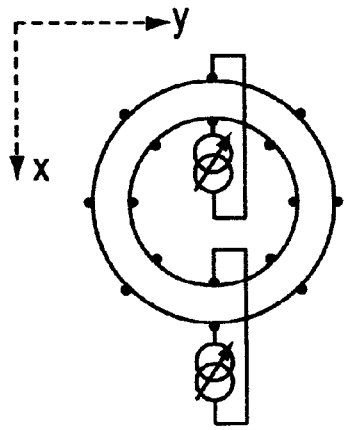
Figure 8C:
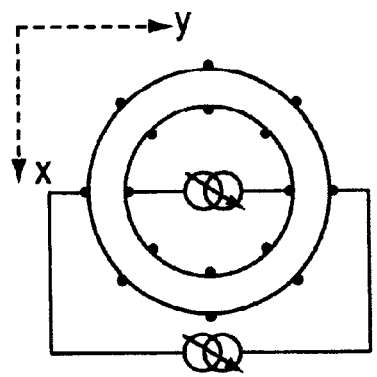
Figure 8D:
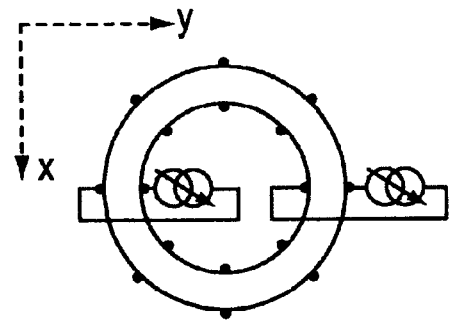
Figure 8E:
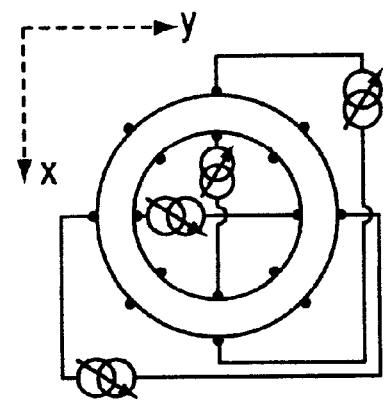
Figure 8F:
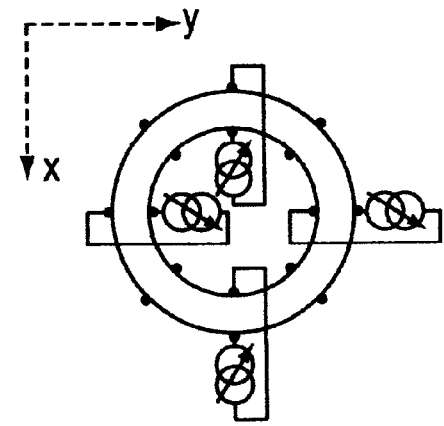

One might proceed beyond double injection to, for example, quadruple injection by compounding configurations. This principle is illustrated using a rotationally symmetric structure, such as an annulus (see FIG. 8). Here, turning the device by 90 degrees results in the same device (cf. FIG. 8(a) and FIG. 8(c), or FIG. 8(b) and FIG. 8(d)). Then, configuration superposition results in an embodiment with quadruple injection as in FIG. 8(e) and 8(f). Such quadruple injection configurations exhibit special properties which are especially useful in separating the piezoresistive- and the Hall- voltages, while simultaneously minimizing the misalignment offset. In the following, we demonstrate the operation of such an embodiment through a simple argument.

Consider an annular device including Hall voltage contacts along the 'diagonals,' as shown in FIG. 9(a), with compensated uniaxial dual current injection as in the experiment of FIG. 2. The device of FIG. 2 can be mapped onto the configuration of FIG. 9(a), when one observes that the branches of the frame shaped "anti-Hall bar within a Hall bar" may be stretched and deformed into a circular annulus (FIG. 9(a)). From the data of FIG. 2, it is clear that the application of shear stress would generate a piezoresistive offset across Hall voltage contacts for the appropriate alignment; one might imagine measuring the effect utilizing a pair of voltmeters connected to the device as shown in FIG. 9(b). Here, the two voltmeters read the same piezoresistive voltage, with opposite signs, under the application of shear stress as the current density vanishes in both branches of the structure and each branch becomes an equipotential. The difference in the signs of the offset voltage indicated by the voltmeters originates from the crossed wiring of the instrument to the sample. Thus, if one applies a ramped magnetic field to the device, the voltmeters swing in opposite directions due to a Hall effect, as shown in FIG. 9(c).

With this same measurement configuration, we consider next the case where compensated double injection occurs perpendicular to the first direction, beginning with the null field (B=0) case with the same shear applied to the specimen. Here, one observes that the two voltmeters show the same offset both in magnitude and sign unlike the previous case (FIG. 9(d)). In addition, a ramped magnetic field (FIG. 9(e)) causes the two voltmeters to swing in the same orientation (clockwise), as in the left voltmeter of FIG. 9(c).

Figure 10A:
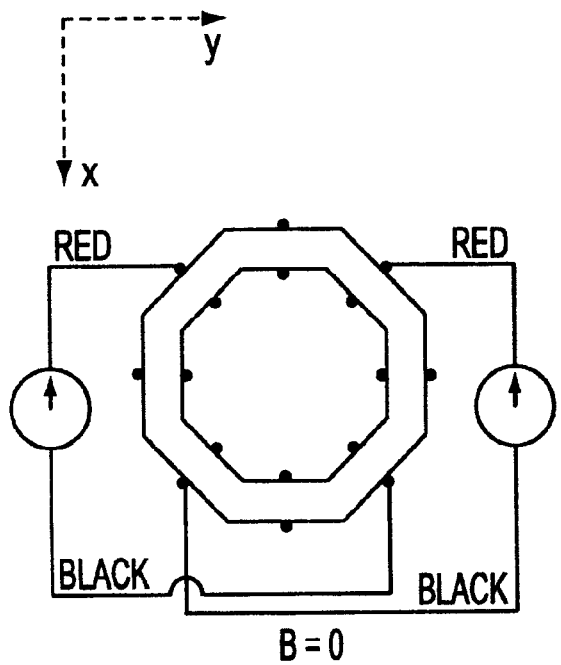
Figure 10B:
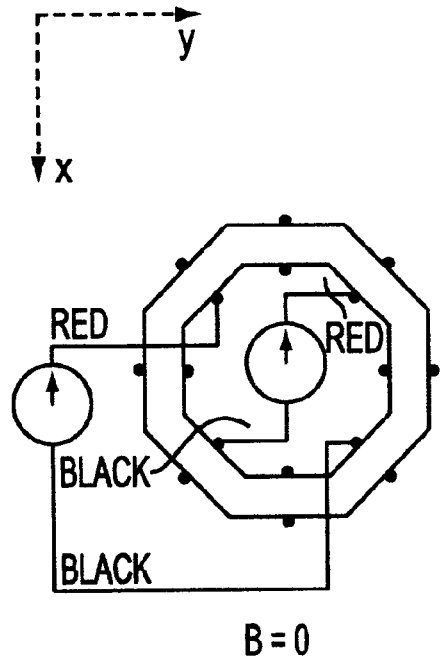
Figure 10C:
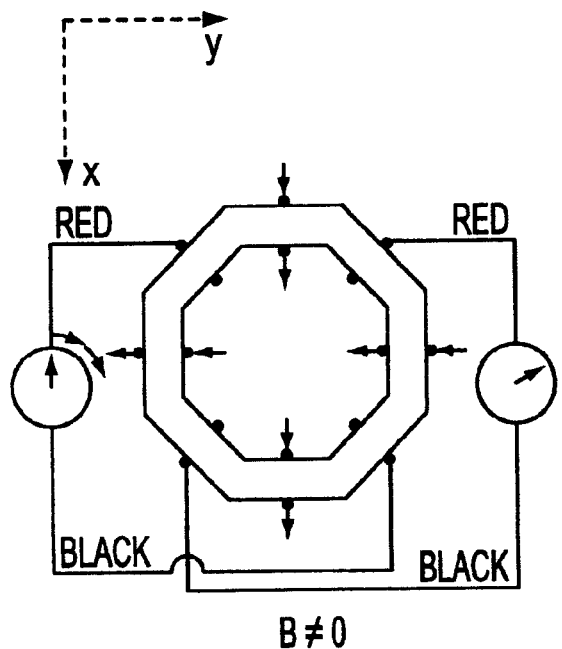
Figure 10D:
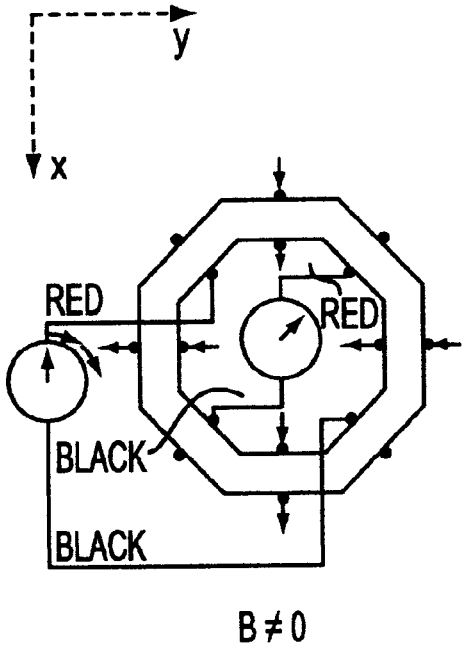
Figure 11A:
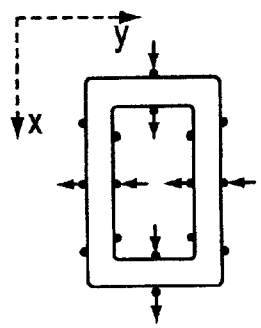
Figure 11B:
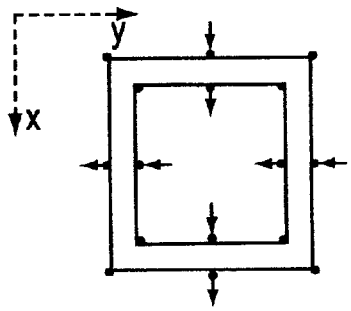
Figure 11C:
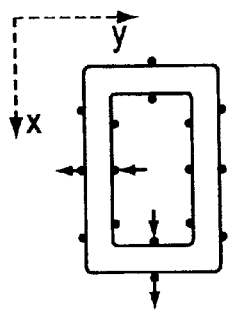
Figure 11D:
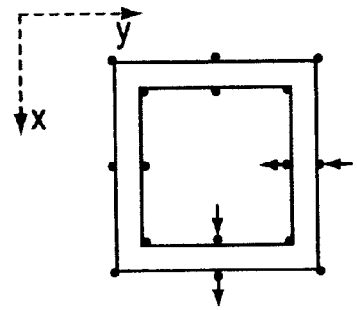
Figure 11E:
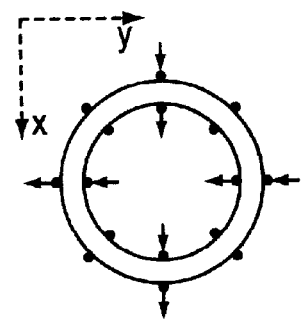
Figure 11F:
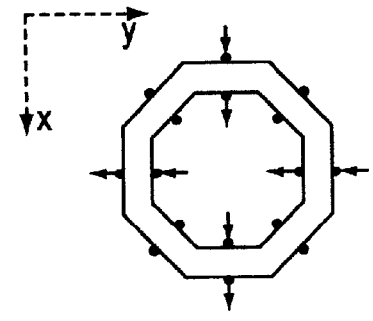
Figure 11G:
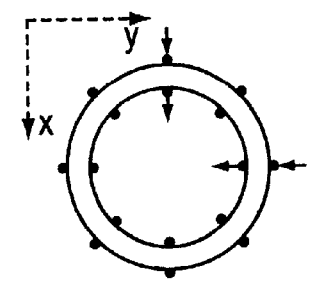
Figure 11G:
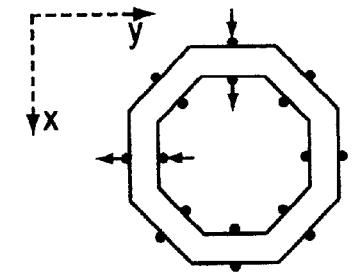
Figure 12A:
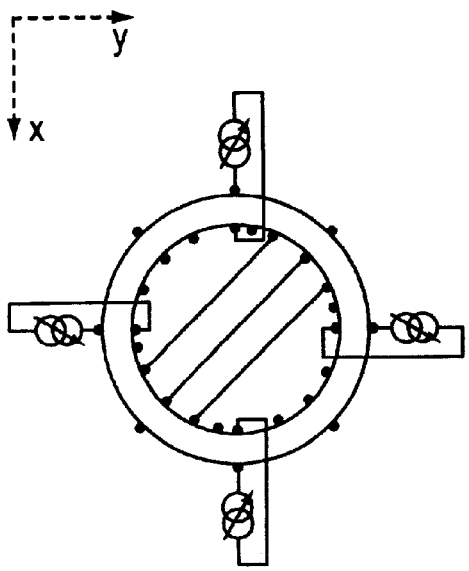
FIG. 12 shows an annulus with four current supplies.
Figure 12B:
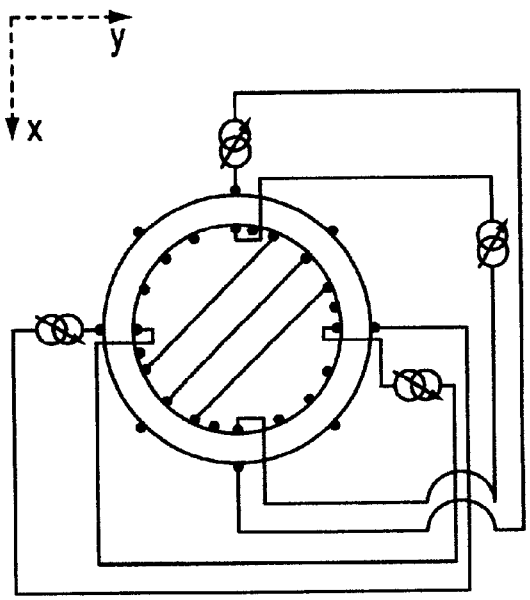
Figure 12C:
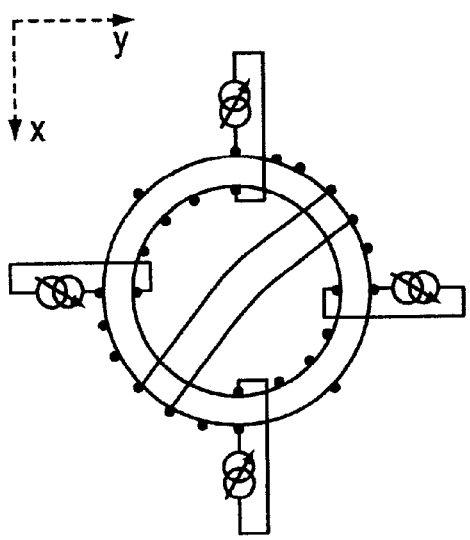
Figure 12D:
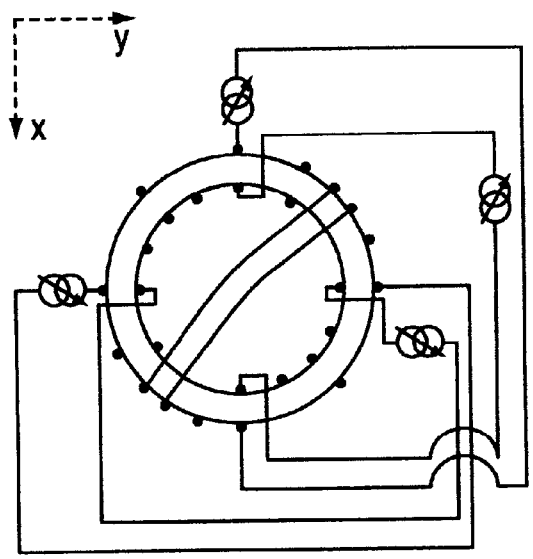
Figure 13A:
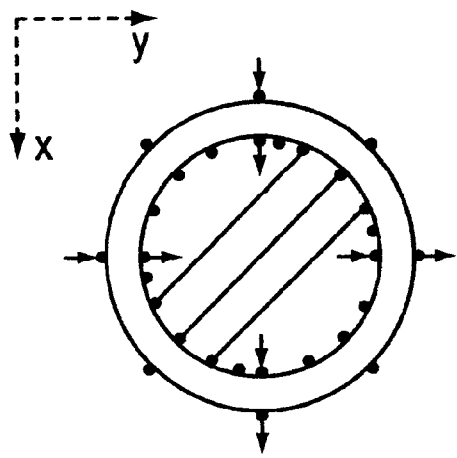
FIG. 13 illustrates injection schemes for realizing "short circuited" off-diagonal-voltage resistors.
Figure 13B:
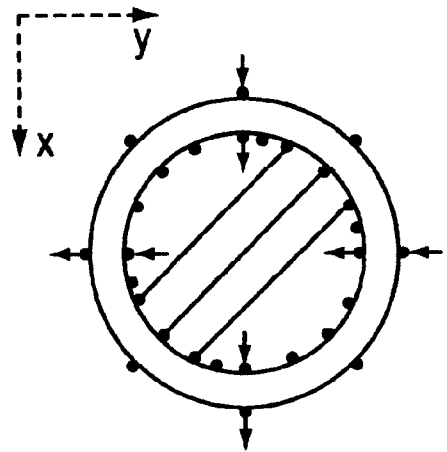
Figure 13C:
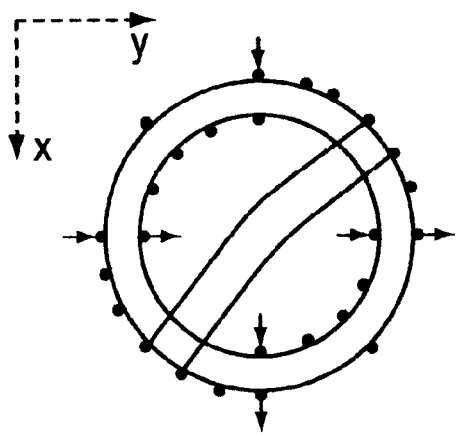
Figure 13D:
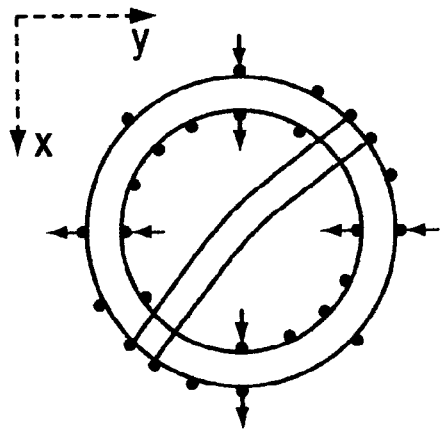
Figure 15A:
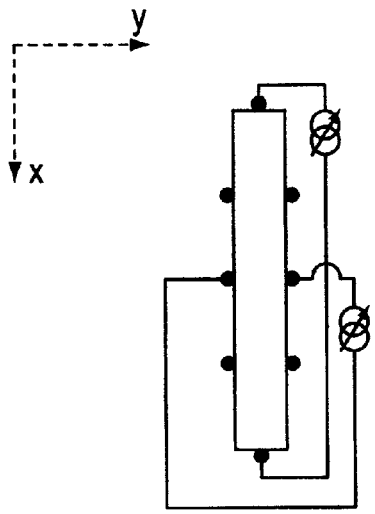
FIG. 15 shows various configurations of conducting plate devices.
Figure 15B:
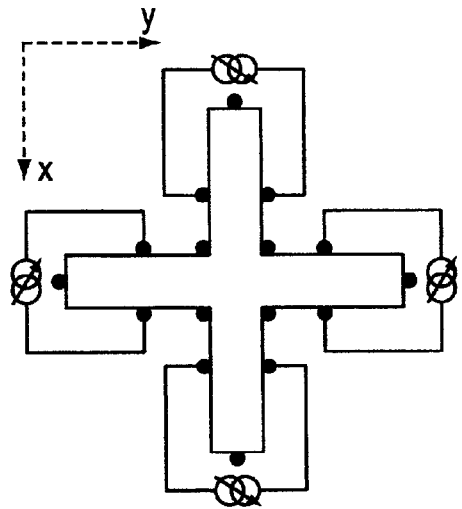
Figure 15C:
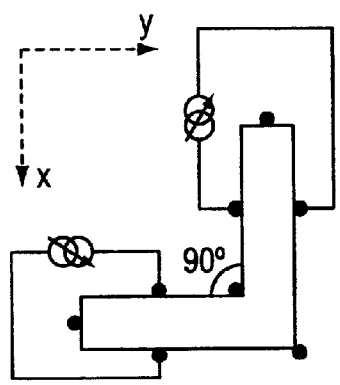
Figure 15D:
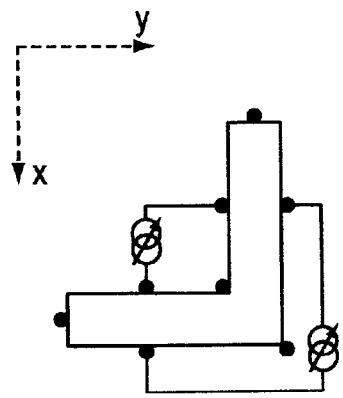
Figure 15E:
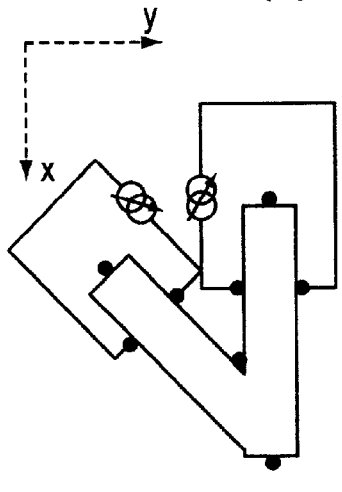
Figure 15F:
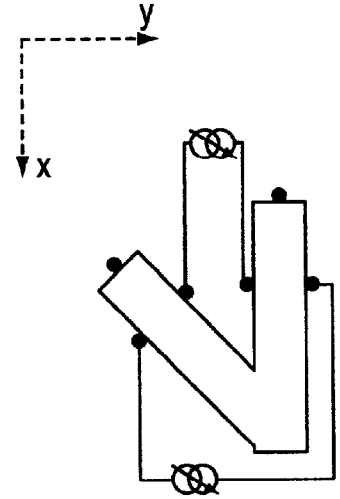

The utilization of electrically separate current sources in these experiments suggests that the solution to the two boundary value problems (FIG. 9(c) and FIG. 9(e)) can be superimposed insitu. Thus, we consider the 'addition' of FIGS. 9(b) and 9(d), in the absence of a magnetic field. Here, one observes that the piezoresistive voltage observed in the two configurations add together in the right voltmeter, while they cancel in the left voltmeter, in order to compensate the piezoresistive offset. The effect of a ramped magnetic field is revealed upon superimposing configurations FIG. 9(c) and FIG. 9(e): Here, the display of the right voltmeter does not turn with increasing B because it rotates in the counterclockwise sense in FIG. 9(c) while it swings in the clockwise sense in FIG. 9(e) and the opposing Hall effects observed in the two orthogonal configurations cancel each other for all B. (This voltmeter shows, however, the sum of the piezoresistive voltages observed in the two configurations). Alternatively, the left voltmeter, which exhibits cancellation of the piezoresistive voltage, shows the display rotating in the same sense in both FIG. 9(c) and FIG. 9(e) in the presence of a magnetic field, and superposition indicates that the magnetic response, or Hall voltage, is the sum of the effects observed in the two (FIG. 9(c) and 9(e)) configurations. Thus, surprisingly, one observes vanishing piezoresistive voltage across the voltage contacts which show a Hall effect, while the other contacts show a piezoresistive voltage and a vanishing Hall effect. Hence, the same sensor may be used to simultaneously and separately measure both Halland piezoresistive- effects. Another advantage of this configuration is that it exhibits "Hall voltage integration," or twice the Hall effect, observed in either configuration individually. A similar argument may also be applied when the voltage contacts are on the interior boundary as in FIG. 10(b) and FIG. 10(d). Here, an octagonal embodiment is considered instead of the circular annulus, with identical results. This suggests that the shape of the doubly connected device could be varied over a wide range of possibilities and one still obtains the same characteristics from the device. This point is illustrated in FIG. 11(a), (b), (e), and (f). These quadruple injection configurations might, of course, be oriented in Silicon using the alignment marks shown on the top of the figure.

The application of this technique for separating the Hall and shear piezoresistive voltages need not be restricted only to devices fabricated in the "high piezo" or "low piezo" alignments. Yet, in practice, there might be some advantage in using the "low piezo" orientation for magnetic field sensors based on Si because the shear piezoresistive voltages are smaller for this alignment, due to the smaller piezoresistive coefficients and, therefore, one expects more effective offset cancellation especially in sensors subjected to inhomogeneous shear stress. As an example, in n-type conducting layers, the "low piezo" orientation for (011) surface Silicon is expected to provide the better performance for Hall sensors, while the "high piezo" (001) surface Silicon is expected to be more optimal for (shear) piezoresistive devices. The quadruple injection configuration shown in FIG. 11((a), (b), (e), and (f)) may also be viewed as the superposition of orthogonal double injection configurations. Such double injection configurations are shown in FIG. 11((c), (d), (g), and (h)). These are useful because the embodiments of FIG. 11 ((c) and (g)) would show no Hall effect in a homogeneous magnetic field, although they would exhibit the piezoresistive effect, when a voltage is measured between the appropriate pair of contacts, for example, between lower left and top right in FIG. 11(c). (In a magnetic field gradient, there would be a contribution from the Hall effect). The embodiments of FIG. 11((d) and (h)), on the other hand, tend to exhibit a Hall effect and vanishing shear dependent piezoresistive effect. (Here, under inhomogeneous shear, there would be a piezo voltage). Several elementary modifications to the quadruple injection configurations are possible, some including connections between pairs of voltage contacts (FIG. 12 and FIG. 13). Such configurations might be useful in geometric magnetoresistor type applications.

The orthogonal injection configurations illustrated in the previous figures lend themselves to further generalizations through, for example, the injection of multiple currents in each branch of the structure (see FIG. 14). Here, superposition of uniaxial 8-fold injection schemes FIG. 14(a)–(d), might be invoked in order to obtain biaxial a 16-fold injection scheme FIG. 14(e)–(h). (In a similar way, one might generalize the result to m-axial, n-fold injection schemes in polygonal type geometries). The same type of arguments indicate that a pair of voltage contacts (along the diagonals in FIG. 14, for example) would exhibit the piezoresistive voltage while another pair would show the Hall voltage. Here, the multi-currents increase the magnitude of the observed voltages proportionately to the number of sources, for constant I, and the effective averaging reduces the residual offset, due to inhomogeneities, observed across the voltage contacts. Thus far, we have mainly considered embodiments including holes because such embodiments appear especially advantageous for engineering the current distribution. Yet, the utility of directional averaging for separating or cancelling insitu one of the off-diagonal components, using electrically isolated supplies, may also be appreciated in hole-less specimens, such as the embodiments shown in FIG. 15. These structures may be aligned in Silicon using the alignment marks, or they may used in any Hall or piezoresistive conductor in the unoriented configuration.

Figure 1A:
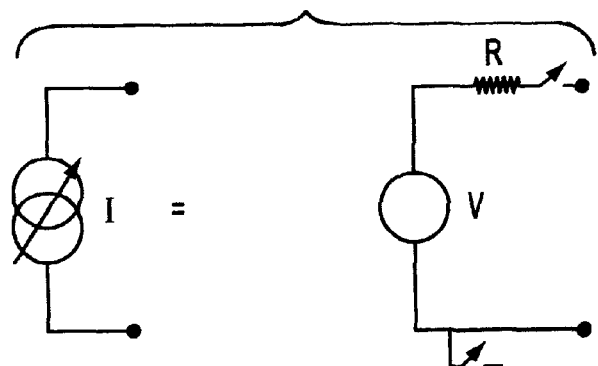
FIG. 1 shows various kinds of current sources.
Figure 1B:
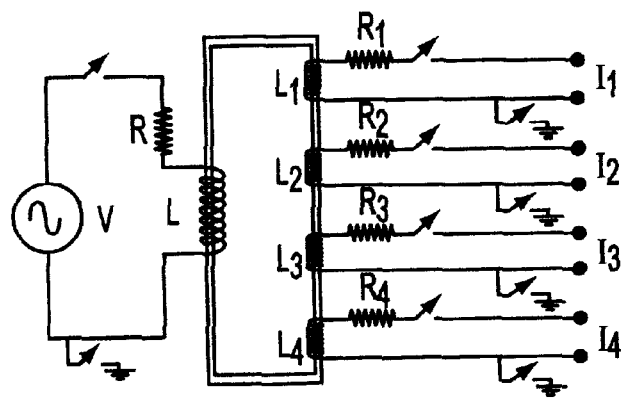
Figure 1C:
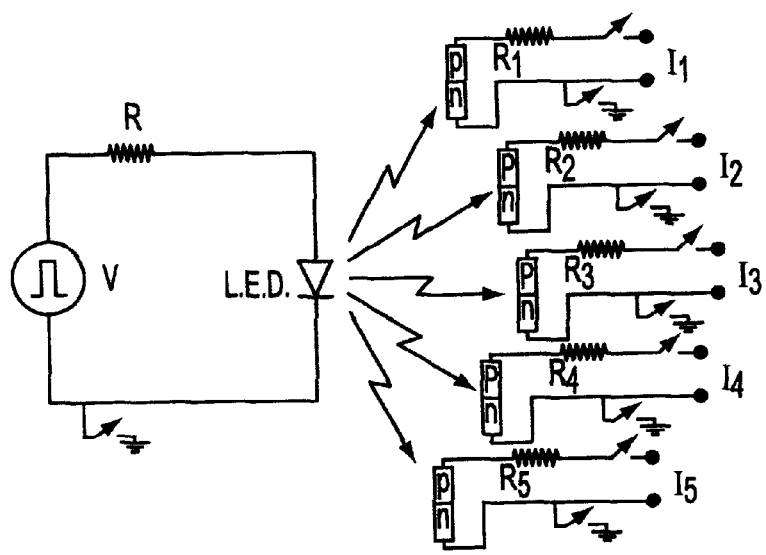
Figure 16A:
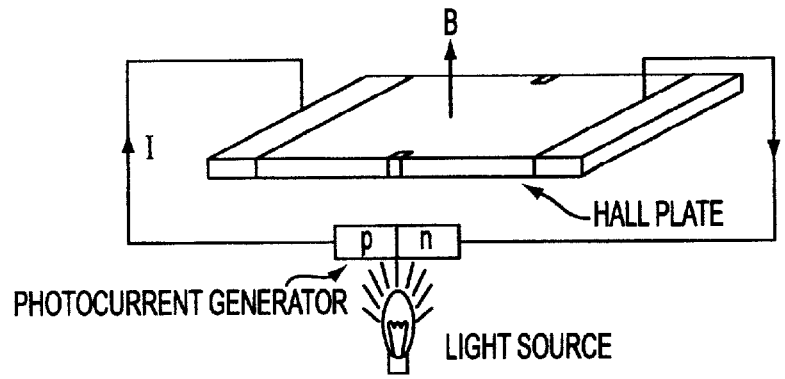
FIG. 16 shows various embodiments of photocurrent generators.
Figure 16B:
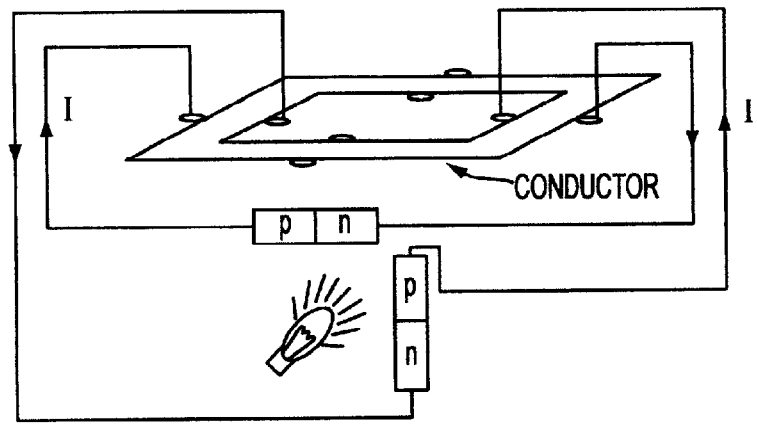
Figure 17A:
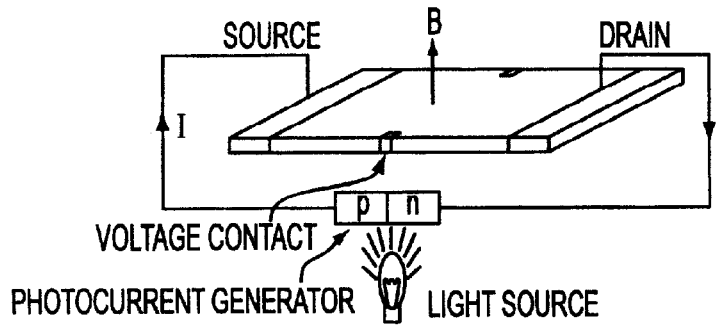
FIG. 17 illustrates the concept of integrating a single photocurrent generator into a Hall piezoresistive element.
Figure 17B:
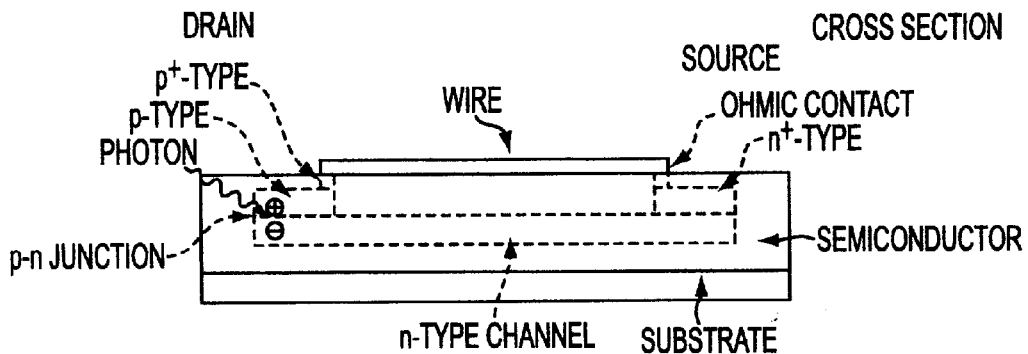
Figure 17C:
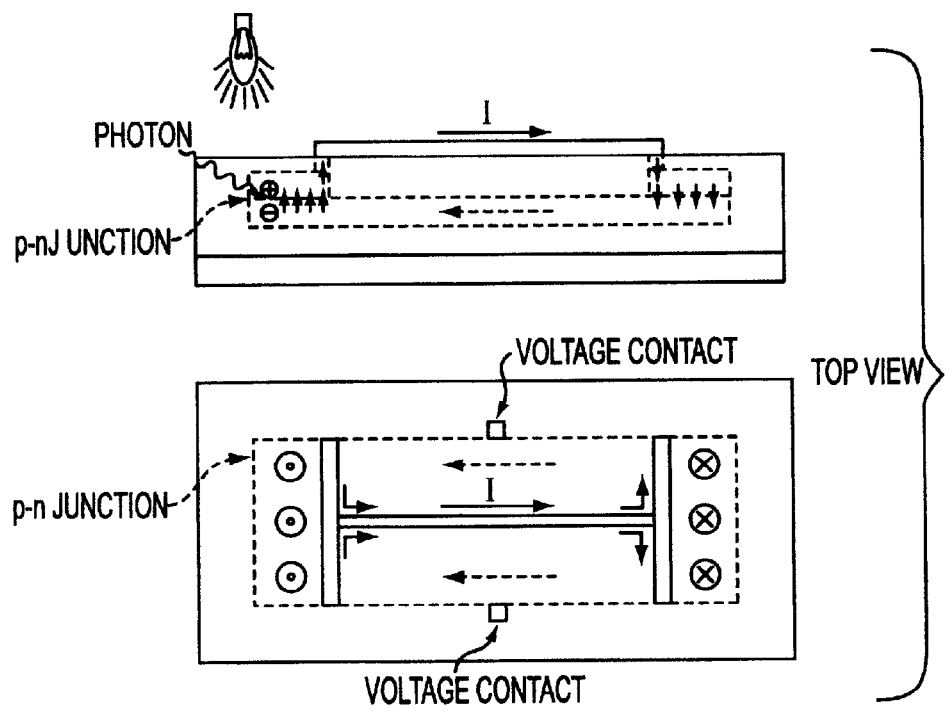
Figure 18A:
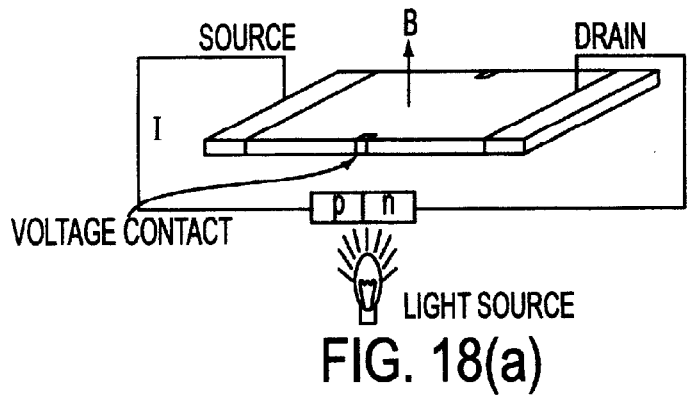
FIGS. 18–21 shows various other embodiments of photocurrent generators.
Figure 18B:
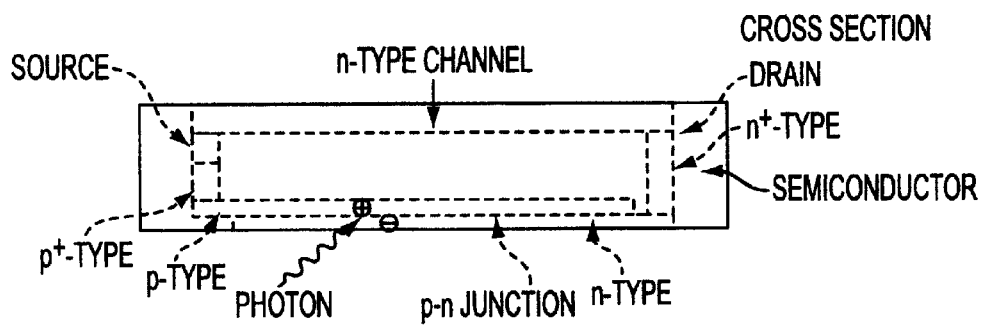
Figure 18C:
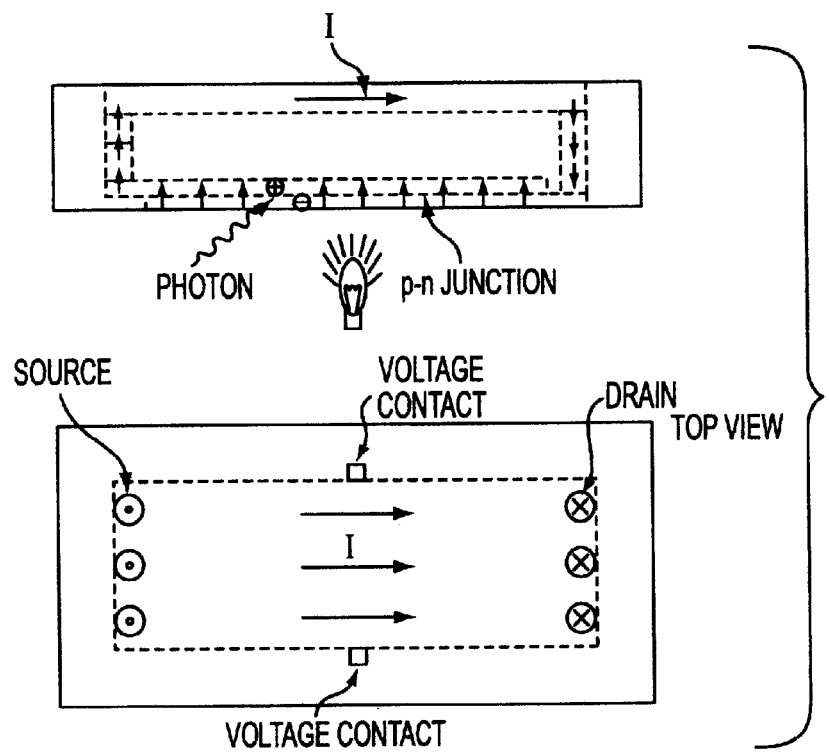
Figure 19A:
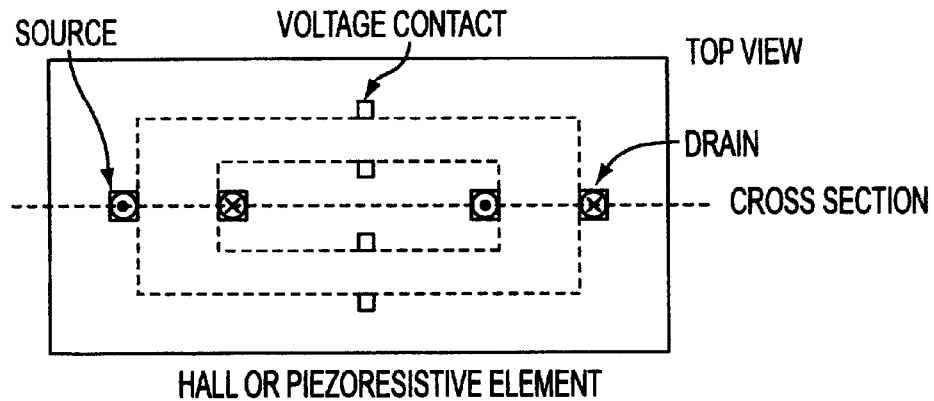
Figure 19B:
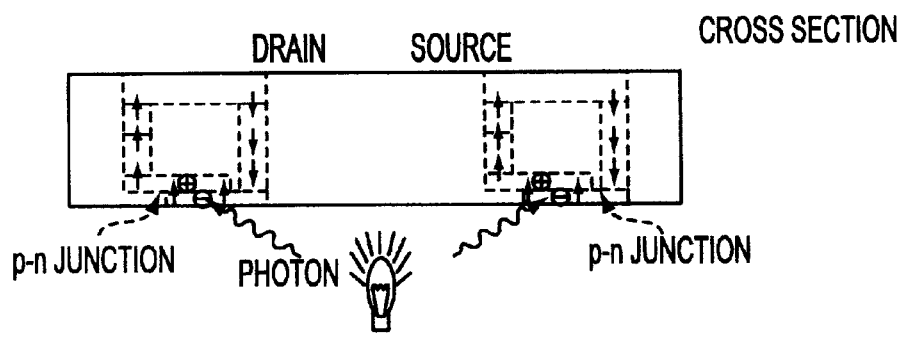
Figure 19C:
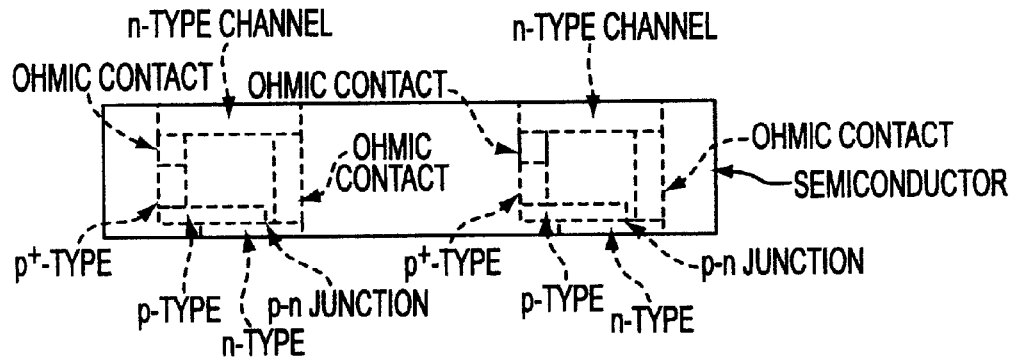
Figure 20A:
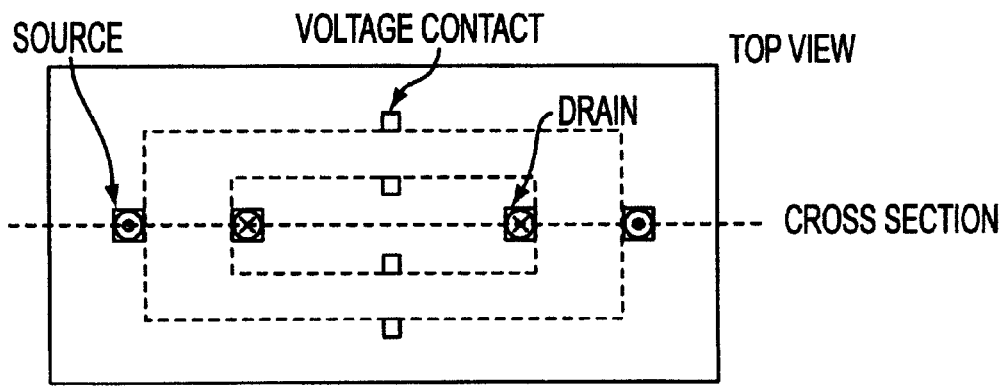
Figure 20B:
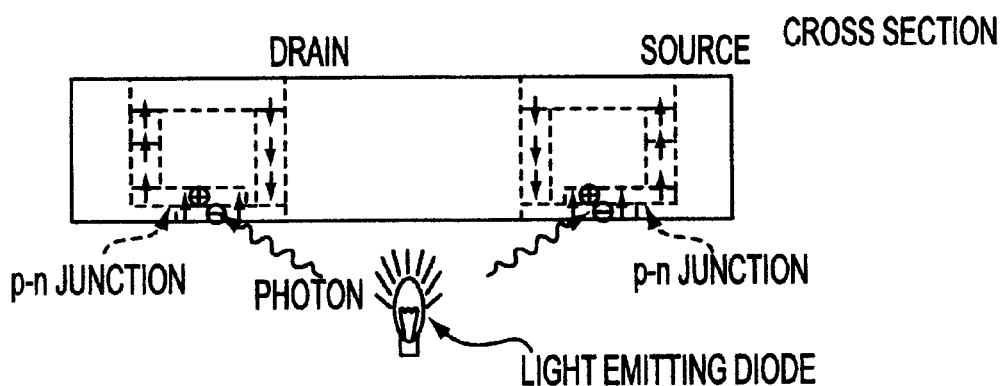
Figure 20C:
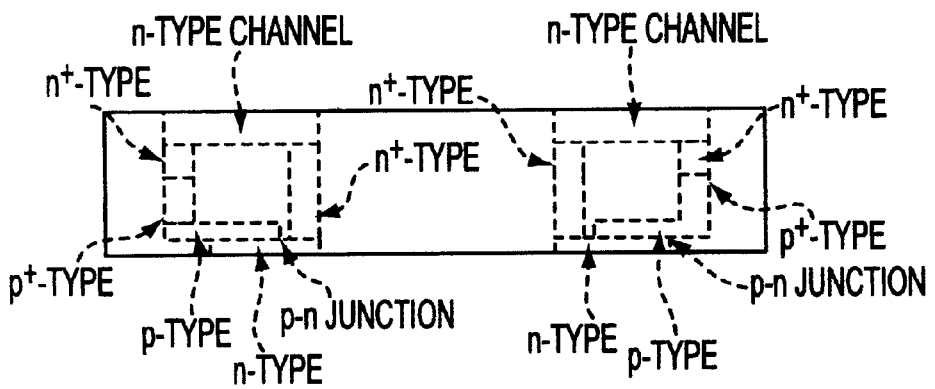
Figure 21A:
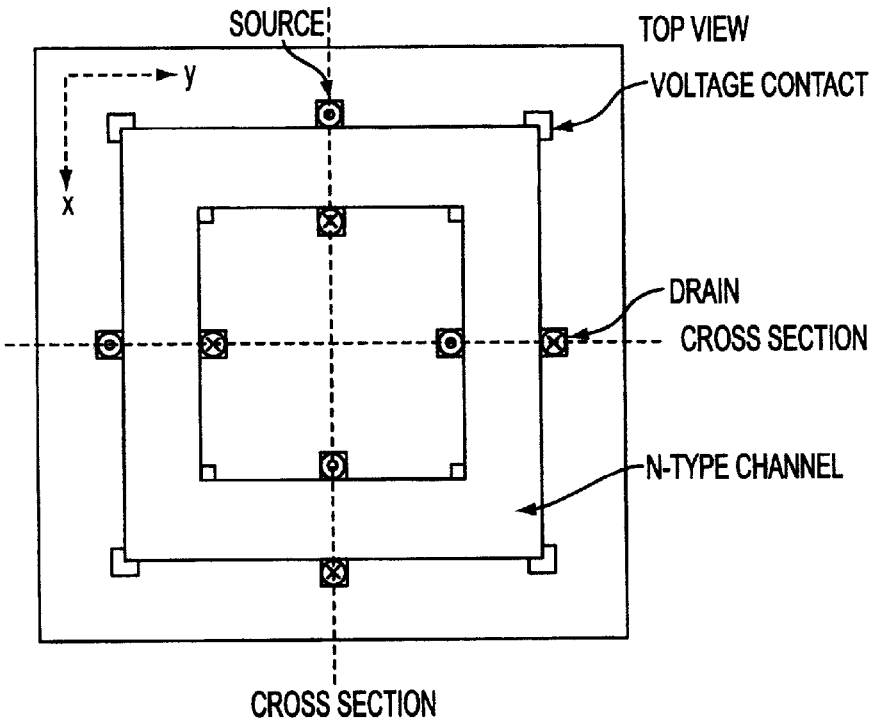
Figure 21B:
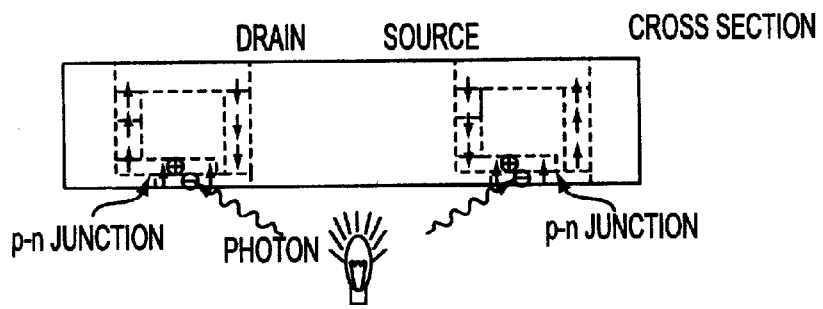
Figure 21C:
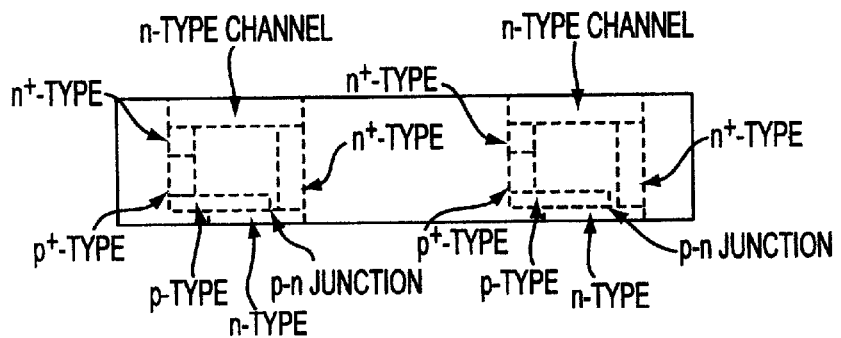

The main limitation on the utility of these techniques seems to be set by the difficulty involved in producing electrically separate current sources (FIG. 1). (Of course, current sources may be exchanged with voltage sources without changing the essential characteristics). Battery-resistor combinations, which constitute the simplest current sources, are cumbersome and unsatisfactory especially in applications where one is limited to a single source (e.g., FIG. 1a). A transformer with a single primary and multiple matched secondaries becomes useful in ac applications (FIG. 1b). However, this approach might be unsatisfactory when device size becomes a constraint. An interesting semiconductor based solution to this problem could recall optocoupler type devices (light emitting diode (LED)—photovoltaic cell combinations). See FIG. 16–21. In FIG. 16(a), we have illustrated the concept of a light powered Hall or piezoresistive sensor, where the photocurrent generator might be a p-n junction. Although one does not necessarily see the advantage of this approach when there is only one current source involved, the utility of this approach becomes self-evident as the number of sources grows (FIG. 16(b) & (c)) in the m-axial, n-fold injection schemes. An advantage of this method is that, in principle, it is straightforward to include p-n junctions on-chip in a Si-based Hall sensor, and these p-n junctions could easily serve as photocurrent generators. Some possible embodiments based on this idea are illustrated in FIG. 17–21. FIG. 17 considers the case where a p-n junction is built into one of the current contacts of an electrical plate. Here, one contact essentially doped to the carrier type opposite that found in the current channel. Then, a wire is used to connect the source and drain to close the current loop. FIG. 18 shows an embodiment where the photocell is on the backside of the electrical plate. This embodiment is interesting because a visual examination of the top-side need not reveal current contacts. FIG. 19 shows an embodiment where dual photocurrent generators are on the backside of the plate. Obviously, one may also arrange these current generators on the topside or any other convenient location. This current biasing configuration corresponds to current compensation which gives minimal misalignment offset in a magnetic field sensor. FIG. 20 shows the current biasing scheme for a magnetic field gradient detector. Additional photocurrent generators may be integrated into the smart sensor in a similar spirit, as shown in FIG. 21, for a biaxial quadruple injection scheme. This embodiment, which may oriented in Silicon for optimal piezoresistive response (using the alignment marks), if desired, allows for separation of diagonal and off-diagonal voltages on different pairs of voltage contacts, as discussed previously. Thus, one sees that photocurrent generators are useful for solving the separated current/voltage supply problem because they may be simply integrated into the sensor, and one could conceivably use just a single LED, running on a single power supply, to power a large number of such sources, and then require just a pair of bonded wires to readout the off-diagonal voltage of interest. (Alternatively, one might imagine electronically implementing the necessary sources and integrating them on-chip). An advanced smart sensor might even include on-chip signal conditioning and logic so that the output is directly compatible to the microprocessor based controller used in an automation system.

FIG. 1) (a) A current source might be a voltage source (V) in series with a resistor (R) and a mechanical/electronic switch. The source might be "grounded" using a second switch, as shown. (b) A set of alternating current (a.c.) sources ($I_1$–$I_4$) might be derived from a single power supply using a transformer with multiple secondaries, each including a switched resistor. (c) Multiple, electrically-separate current sources might also be realized by optoelectronic means. Here, a light emitting diode (LED), which is driven by a voltage source (V) in series with a resistor (R), might illuminate an array of photovoltaic cells (e.g., p-n junctions). The photoinduced production of electron-hole pairs, and charge separation by the electric field in the depletion region, makes possible a (closed circuit) current ($I_1$–$I_5$) which may be limited by resistors $R_1$–$R_5$. The light source might be switched periodically for applications which require a time-varying current, for example, and the photovoltaic cells might even be integrated into the advanced sensor.

FIG. 2) (top) An "anti Hall-bar within a Hall bar" (frame-shaped) configuration realized on (001) surface n-channel Silicon. Two current sources, $I_{1,2}$ and $I_{A,B}$ are connected between contact pairs (1,2) and (A,B), respectively. The long axis of the frame shaped specimen is oriented along the [110] direction. The sample is glued and wired to a dual in-line package (DIP), and shear stress is coupled to the specimen by torquing the package while it is plugged into the DIP receptacle using a lever arm, as indicated. This packaging procedure produces built-in shear stress upon the specimen, even in the absence of a force on the end of the lever arm. (a) The voltage $V_{C,D}$ measured between the contact pair (C,D) on the external boundary for current injected: via the external boundary only, via the internal boundary only, and for equal- and opposite- currents injected via the two boundaries. Under current compensation $I_{1,2}=-I_{A,B}$, there is no current in the vicinity of the voltage contacts, and the misalignment offset is expected to be vanishingly small. The observed linear variation with torque shows, however, the existence of an off-diagonal (Hall effect like) component that depends upon shear stress. In the vicinity of torque=90, the shear (or off-diagonal piezoresistive) component vanishes and, then, the total offset voltage originating from both the misalignment and stress components becomes small. For torque=90, if one switches off one of the two injected currents, then the offset voltage increases in magnitude, and this is the misalignment contribution. (b) The voltage $V_{3,4}$ measured between the contact pair (3,4) on the interior boundary. Under current compensation, $I_{1,2}=-I_{A,B}$, the variation of $V_{3,4}$ with torque is similar to that observed in $V_{C,D}$. The arrows near torque=90 show the change in the offset voltage upon current compensation. These data were collected in the absence of an externally applied magnetic field, and the torque scale, which is reported in arbitrary units, serves only to convey relative changes in the stress applied to the specimen. It is worth noting that the sensitivity to shear is relatively large for this crystallographic orientation, and thus, this device may serve as a misalignment offset-voltage compensated shear sensor, when the current in the vicinity of the voltage contacts vanishes. If the frame shaped specimen is rotated in plane by 45 degrees, so that the major axis lies along [100], then the shear sensitivity is greatly reduced and the device may be utilized also as a offset compensated Hall effect (magnetic field) sensor. Thus, one may choose a preferred orientation for the specimen according to the desired device characteristics.

FIG. 3) This chart identifies the alignment of the device geometry with respect to the crystallographic axis, for n- and p- channel Silicon with the normal (001) {(a) and (b)}, (011) {(c) and (d)}, and (111) {(e)}. Using similar principles, the alignment with respect to the crystallographic axis may also be identified for other Silicon surfaces, and other piezoresistive semiconductors (e.g. Germanium, Silicon-Germanium). In (a)–(f), (i) identifies the orientation for high shear piezoresistive response, which one may choose if one desires to make, for example, a piezoresistive sensor. On the other hand, (ii) shows the orientation for low piezoresistive response, which one might choose if one is interested in minimizing this component (as, for example, in a Hall effect sensor).

Figure 3A:
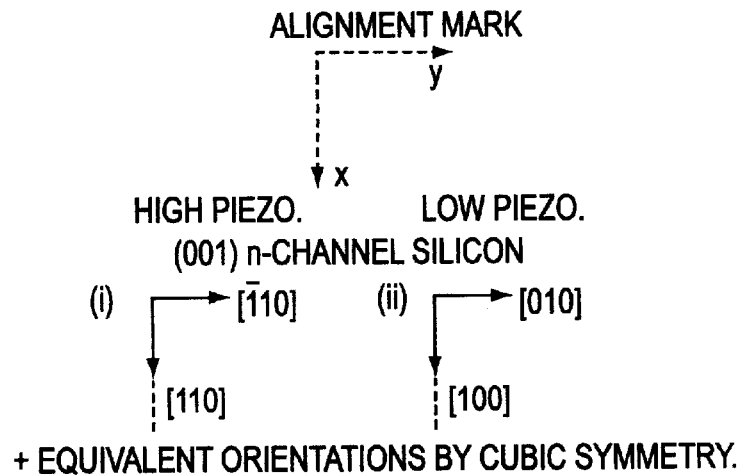
FIG. 3 is a chart identifying the alignment for device geometry with respect to a crystallographic axis for n- and p-channel Silicon.
Figure 3B:
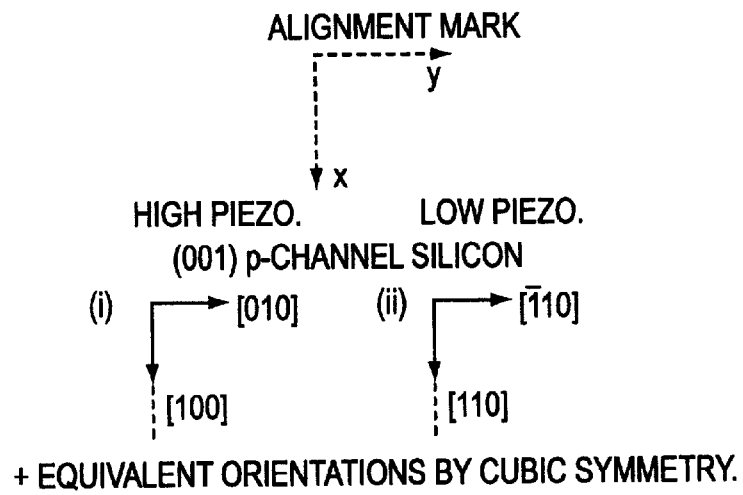
Figure 3C:
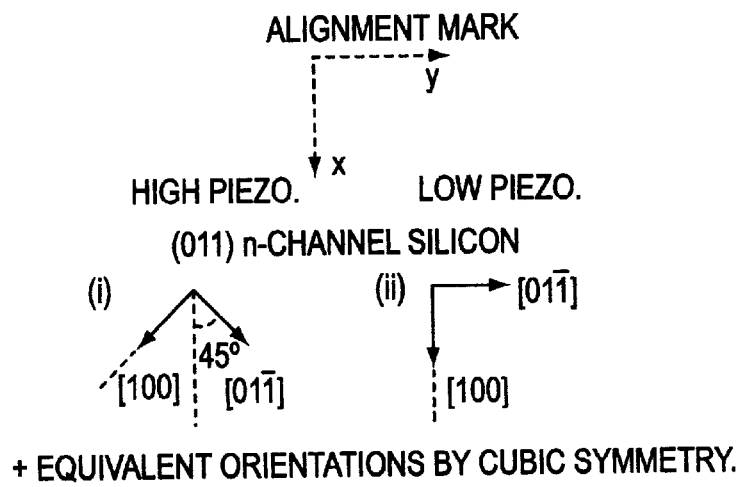
Figure 3D:
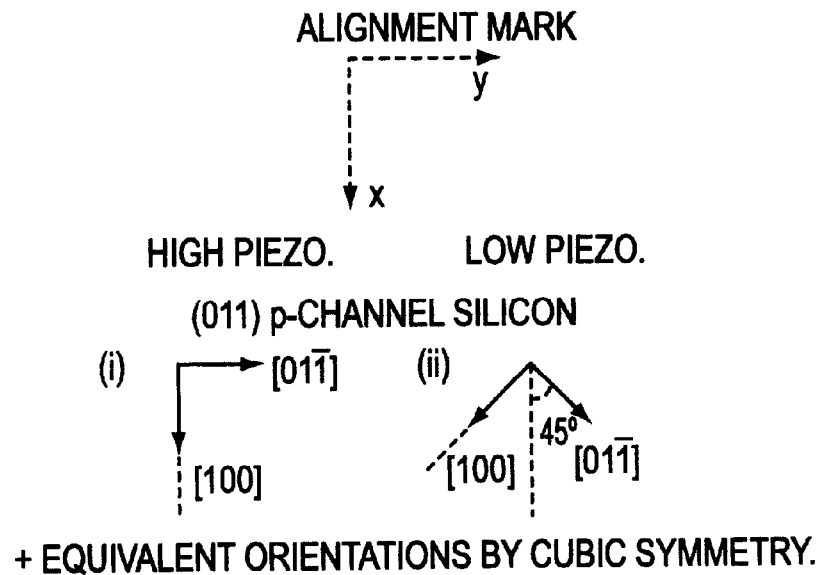
Figure 3E:
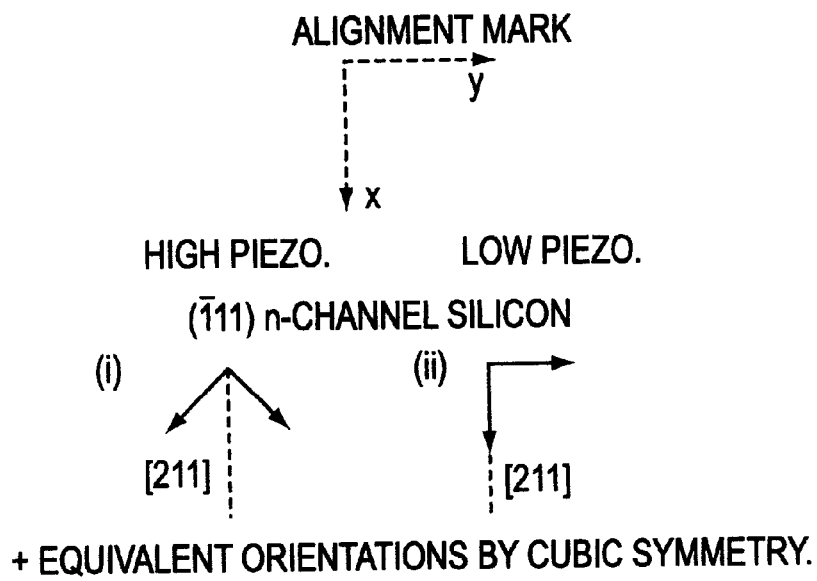

As an example, we illustrate the use of this chart by referring to the frame shaped specimens of FIG. 4, and consider the case where we wish to realize the low shear piezoresistive orientation in (001) n-Silicon. (For this exercise, it might be useful to have transparent copies of these FIGS. 3 and 4). Thus, the relevant alignment is shown in FIG. 3(a) (ii). This means that on the appropriate (001) surface Silicon crystal, we mark the desired [100] and [010] directions, and we place FIG. 3(a)(ii) atop the marked axis on the crystal with the [100] direction in the figure along the [100] direction in the crystal. Take FIG. 4 and align the "alignment marks" on FIG. 4 with similar marks on FIG. 3 (this orients the embodiment with respect to the crystallographic axis), and then trace a suitable scaled version of the embodiment onto the crystal by, for example, photolithography. Of course, an error of the order of 15 degrees, with respect to the crystallographic axis, may be tolerated in this procedure, and one may also fabricate the geometries in the unoriented crystal or polycrystal or film, if so desired. The dashed axis or "alignment marks" appear in several figures throughout the application.

FIG. 4) Some special embodiments of the frame shaped "anti Hall bar within a Hall bar" (a) Uniaxial, interboundary (single) current injection in the 'anti Hall bar within a Hall bar' (Hall bar with a hole). The shaded circles (disks) are contacts, which may assume a wide variation in its shape and size relative to the frame. The length and width of the two branches of the doubly connected structure, the ends, the hole, and the exterior boundary are free parameters. Hall effect and shear piezoresistive ("off-diagonal") voltages may be observed in intraboundary voltage measurements. Magnetoresistive (Corbino) type voltages may also be observed in interboundary voltage measurements, at high magnetic fields. (b) Uniaxial, double injection, with current sources connected in the interboundary configuration. (c) Uniaxial double injection with current sources in the intraboundary configuration. An offdiagonal (Hall or piezoresistive) voltage can occur here even when there is no current in the vicinity of the Hall voltage contacts. (d) Current injection within the hole, which may also be viewed as the "anti Hall bar" configuration. Global off diagonal voltages occur on the internal boundary, between the shaded voltage contacts. (e) similar to (c) with a difference that pairs of contacts have been connected to each other using an electrical conductor. Here, three such connections have been included, however, the number could be arbitrary. A magnetic field (stress) dependent resistance can appear between connections. Instead of a simple connection, one may include active and passive elements within the circuit. (f) analogous to (e) with a difference that wires connect pairs of contacts on the exterior boundary. (g) similar to (f) with the addition that contacts plough through the conductor (thick shaded lines) and link opposite edges of the exterior boundary. (h) similar to (e) with the addition that contacts plough through the conducting channel and connect points on opposite side of the hole within the element. The number of such ploughed contacts could be arbitrarily large. All these configurations could be oriented on Silicon using the alignment marks shown at the top, and they may also be fabricated in the unoriented configuration on Silicon or any other electrical conductor.

Figure 5C:
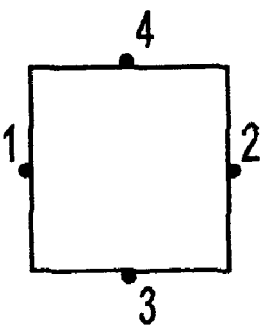
FIG. 5 shows matrixes representing electrical characteristics for a four contact conducting element.
Figure 6A:
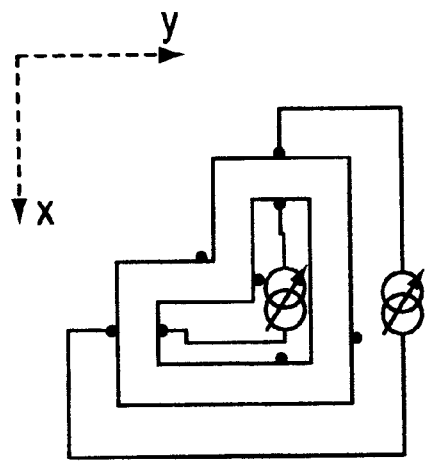
FIGS. 6–7 shows various configurations for electrical conductors.
Figure 6B:
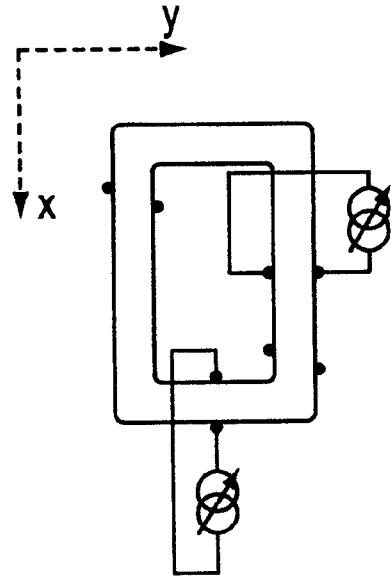
Figure 6D:
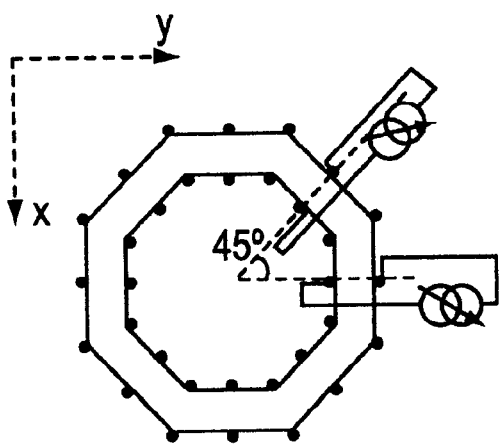
Figure 6C:
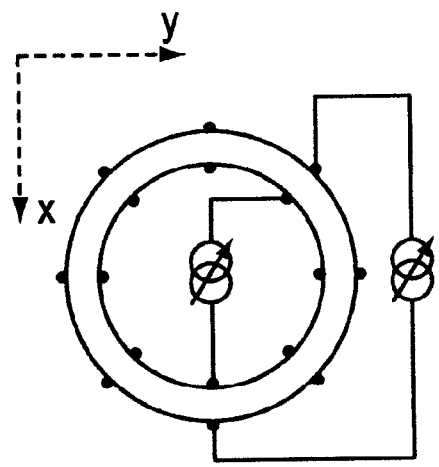
Figure 7A:
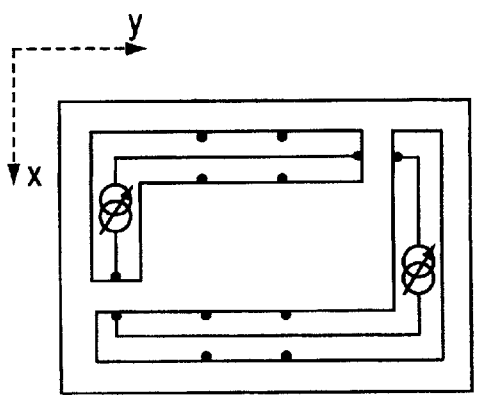
Figure 7B:
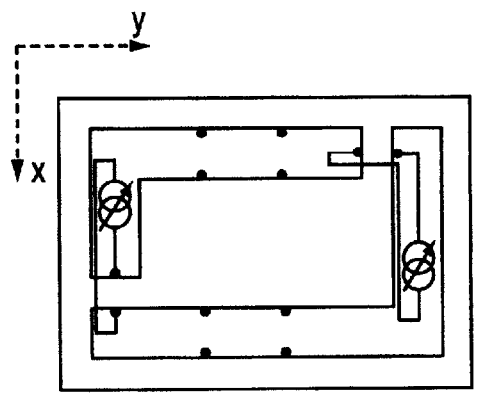
Figure 7C:
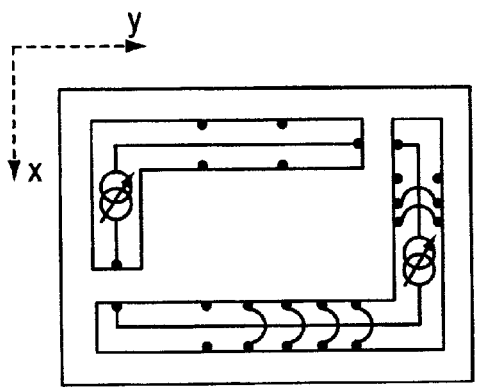
Figure 7D:
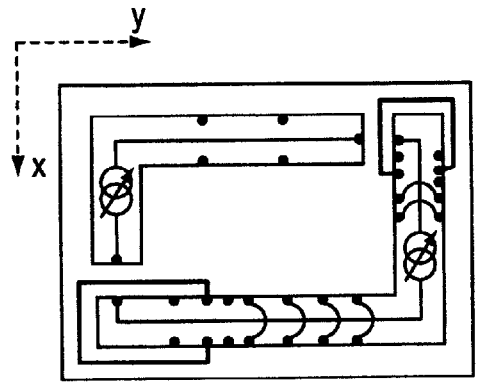
Figure 7E:
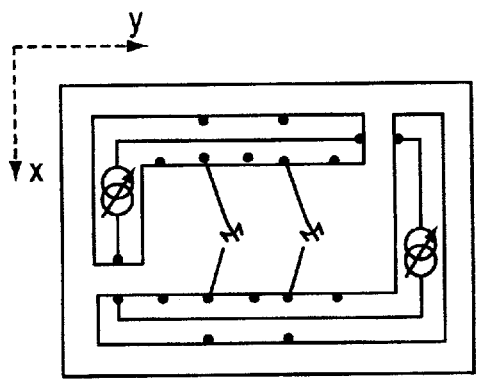
Figure 7F:
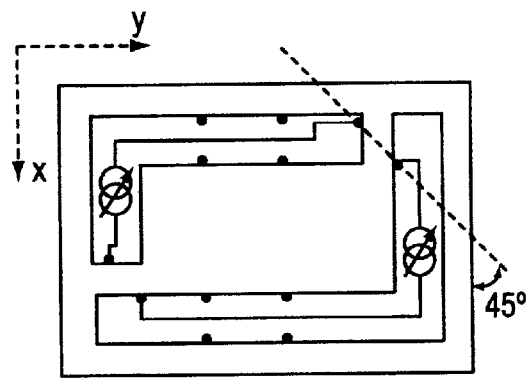

FIG. 5) (top) an electrically conducting element with four contacts (1–4). A 4×4 resistance matrix serves to relate the voltages $V_{1,2}$ and $V_{3,4}$, measured between contact pairs (1,2) and (3,4), respectively, to the currents $I_{1,2}$ and $I_{3,4}$ injected between contact pairs (1,2) and (3,4). In general, the matrix may include off-diagonal elements $R_{1,2;3,4}$ and $R_{3,4;1,2}$ which result in voltages orthogonal to the current flow. We have referred to (and will refer to) such voltages as "off-diagonal" voltages. (a) The behavior of the off-diagonal voltages for a symmetrical resistance tensor. (i) A current is injected only via contacts (1,2). The offdiagonal voltage $V_{3,4}$ is positive. (ii) A current is injected only via the contacts (3,4). The off diagonal voltage $V_{1,2}$ is also positive. (b) The behavior of the off-diagonal voltages for an antisymmetrical resistance tensor. (i) A current is injected only via contacts (1,2). The off-diagonal voltage $V_{3,4}$ is positive. (ii) A current is injected only via the contacts (3,4). The off-diagonal voltage $V_{1,2}$ is now negative, unlike in (a) (ii). (c) The most general resistance tensor, within the scope of this model, may include both symmetric and antisymmetric components. The symmetric component may be reflected in the sensor as an offdiagonal piezovoltage, proportional to the factor f(s), while the antisymmetrical offdiagonal voltage may be viewed as a Hall voltage proportional to the factor g(B). One is sometimes interested in separating the two contributions in order to improve sensor performance, and one often builds a sensor which operates due to existence of such effects. We are interested in optimizing sensor performance by controlling the current distribution within the sensor by adjusting device geometry, appropriately alinging the sensor with respect to the crystallographic axis, and perhaps even injecting more than one current into the specimen with possible finite angle between the currents.

FIG. 6) (a) A L-shaped hole inside a L-shaped electrical conductor, with contacts inside the hole and at the circumference of the sample. A first current source is wired to a pair of contacts on the exterior boundary, and a second source is wired to the interior boundary, such that there is a finite angle, e.g., 90 degrees, between the current vectors at the source and drain of each supply. (b) A frame shaped hole inside a frame shaped electrical conductor with several contacts at each boundary. A pair of current sources are connected between the exterior and interior boundaries, at a distance from each other, such that there are two currents with a finite angle, e.g., 90 degrees, within the specimen, although the angle between the current vectors at the source and drain of each supply is somewhat smaller. (c) a circular hole inside a circular conductor, with several contacts in the vicinity of each boundary. A current supply is hooked up to each boundary such that there is a finite angle (0<υ<180) between the current vectors at the source and drain of each supply. (d) A n-fold rotationally symmetric structure (e.g. n=8) with several contacts at each boundary, with a current supply connected between the outside and the inside, with a finite angle, e.g., 45 degrees, between the two different currents. In all these configurations, off-diagonal voltages may appear between voltage contacts upon the application of stress and/or magnetic field. (b) and (d) allow for the possibility of null current in the vicinity of the voltage contacts. (a) and (c) allow for the possibility of a Hall voltage on a boundary which depends mainly on the current injected via the same boundary. These special embodiments may be oriented on Silicon using the alignment marks and they may used in the unoriented configuration on any electrical conductor.

FIG. 7) (a) A conductor including two L shaped holes. Each hole has a source and drain contact at the ends, and a supply is connected to these contacts. There are also voltage contacts inside each hole for measuring the voltages. A feature of this device is that currents, for example, may be adjusted in sign and magnitude such that current flows predominantly in the gap between the holes, in the vicinity of the current contacts, and the currents are oriented perpendicularly with respect to each other. (This configuration is similar to that shown in FIG. 6(a), with the difference that a second internal boundary plays the role of the external boundary in FIG. 6(a). By adjusting the shape of the holes, the current orientations may also be adjusted to arbitrary angles). (b) A double hole device where current supplies are connected between boundaries. (c) same as (a) with the difference that pairs of contacts have been electrically connected across the hole. (d) same as (c) with the addition that contacts plough through the material and connect contacts on opposite sides of the line connecting source and drain. Only one such connection has been shown on each end of a hole, but the number could be arbitrary. (e) same as (a) with the addition that pairs of contacts on different holes are connected electrically over a switch (as shown). (f) same as (a) with a difference that the current contacts at the ends of the hole have been shifted to obtain a parallel current vectors under current compensation. One could generalize such configurations to include an arbitrary number of arbitrarily shaped holes, with arbitrary angles between the various currents.

FIG. 8) This figure demonstrates the principle of producing a dual axis, quadruple—(current) injection device from two uniaxial double injection configurations. (a) A configuration including a hole in the conductor which allows two boundary specific off-diagonal voltages, such as the Hall effect, due to double current injection. (b) An alternate wiring configuration which can even be used to cancel the boundary specific off-diagonal voltage such that it is mostly sensitive to gradients in the off-diagonal resistivity. (c) the configuration of (a) rotated by 90 degrees. (d) the configuration of (b) rotated by 90 degrees. (e) the "addition" of configurations (a) and (c). (f) the "addition" of configurations (b) and (d). In (e) and (f) there are four current sources connected to the conductor. Off diagonal voltages may be measured between pairs of free contacts, on a boundary, when the current vanishes in the vicinity of the contacts.

FIG. 9) A physical argument illustrating the operation of a biaxial quadruple injection device in separating the piezoresistive and Hall ("off-diagonal") voltages, while minimizing the voltage contact misalignment offset, in devices including a hole. (a) A rotationally symmetric device with a hole, e.g., annulus, and contacts within the interior boundary and outside the exterior boundary. There is no current injected into the device. Two voltmeters (each red-black lead pair connects to one voltmeter) are used to read out the voltage difference between the left and right sides of the device. The voltmeters are denoted by a circle here, with an arrow inside it. The absence of a voltage difference corresponds to twelve o'clock. (b) A special uniaxial double injection configuration where current is injected via the interior boundary and also the exterior boundary. One might imagine that the conducting element shows a "off-diagonal"

piezoresistive voltage due to the application (intentionally or unintentionally) of stress. Thus, the voltmeters display a voltage difference between the left and right sides of the device in the absence of a magnetic field (B=0). Note that the two voltmeters show readings of opposite sign. This is just a feature of wiring the two voltmeters in the opposite sense. (c) The application of a magnetic field produces a Hall effect which modifies the displayed voltage. One imagines a ramped magnetic field which "turns the clock" on both voltmeters. Note, however, that the clocks turn in opposite directions because the voltmeters were wired opposing each other. (d) From (a), one might proceed by considering the other possibility where currents are injected orthogonally with respect to the orientation chosen in (b) (compare (b) with (d)). Here, in the absence of a magnetic field, with the same shear stress as before, the two voltmeters display readings of the same polarity because the instruments are now connected in the same sense (The "red" leads from both voltmeters lie on the same side of the device). In addition, the application of a magnetic field rotates the two displays in the same sense (see (e)). (f) If one simultaneously injects currents along the two axis, then one essentially superimposes the configurations of (c) and (e), and the voltmeters display the corresponding results: The left voltmeter displays vanishing piezoresistive voltage because the contributions from configurations (c) and (e) cancel. However, the Hall voltages add up to produce twice the Hall effect, which is indicated by the increased angular frequency of the left clock. On the right voltmeter, the piezoresistive contribution from (c) and (e) add up to give the sum of the off-diagonal voltages observed in the absence of a magnetic field, while the Hall effect contribution from the two configurations cancel to give a vanishing Hall effect, as indicated by the arrested clock display. This argument shows that the two contributions to the off-diagonal voltage, that originating from stress and magnetic field, respectively, may be separated utilizing this quadruple injection configuration, and that both contributions may be read out separately and simultaneously from the same device. This configuration is useful because the Hall sensor may be made relatively insensitive to stress. Of course, this technique is also useful for making a stress sensor that is insensitive to magnetic fields, for example.

FIG. 10) In the previous example, the argument (which follows experiment) was presented with voltage contacts on the exterior boundary of the sample. One may replace the circular annulus with an eight fold rotationally symmetric structure including voltage contacts on the exterior, as in FIG. 10(a) and 10(c), with similar results. It turns out that voltmeters connected to the interior boundary (see FIG. 10(b) and FIG. 10(d)) exhibit similar behavior, and one might repeat the previous arguments to obtain this result. That is, for biaxial quadruple injection (see FIG. 10(d)), one "interior" voltmeter shows the piezoresistive contribution while the other shows mainly the Hall voltage, and the Hall voltage is twice what is measured in the uniaxial double current injection configuration (FIG. 9), just as the piezo voltage is the sum of what is measured in the two configurations individually.

FIG. 11) Orientation of the (biaxial) injected currents, represented by arrows, in devices including a hole within the Hall or piezoresistive element. Such configurations are useful for separating the Hall effect from the piezoresistive voltage, as reasoned in FIG. 9 and FIG. 10. In addition, absence of current in the vicinity of the voltage contacts, when all injected currents have the same magnitude, helps reduce the voltage-contact misalignment offset. Here, the geometry may be frame shaped (a), or square-like (b), or circular (e), or show n-fold rotational symmetry as in the 8-fold symmetric octogon (f). The quadruple injection configuration shown in (a), (b), (e), and (f) may be viewed as the superposition of orthogonal double injection configurations. Such double injection configurations are shown in (c), (d), (g), and (h). Here, (c) and (g) would show no Hall effect in a homogeneous magnetic field, although they would exhibit the piezoresistive effect when a voltage is measured between the appropriate pair of contacts, for example, between lower left and top right in (c). (d) and (h), on the other hand, exhibit a Hall effect and vanishing shear dependent piezoresistive effect. These differently shaped geometries produce physically equivalent effects because the important parameters are the current biasing configurations and also the crystallographic orientation. Hence, one may imagine other equivalent doubly connected configurations to realize the same effect. These devices may be oriented along preferred crystallographic axis within the conducting material in order to minimize or maximize the off-diagonal voltages originating from the piezoresistive effect. If such configurations are fabricated on Silicon, one might utilize the orientation marks in conjunction with FIG. 3, as explained earlier, in order to exploit variations of the shear piezoresistive coefficients within the crystal. In addition, one may utilize unoriented configurations in any conducting system, including, for example, Si, GaAs, InAs, InSb, HgCdTe, Si-Ge, Ge, Au, etc.

FIG. 12) (a) An annulus with four current supplies spaced angularly by approximately 90 degrees. Current sources connect between the outer and inner boundaries. There are several contacts on the exterior- as well as the interior-boundary. Voltage contacts have been electrically connected diagonally across the interior boundary (this is an elementary modification to the basic quadruple injection device). These electrical connections could be a simple short circuit (as shown) or they might be complicated switched circuits including resistive, inductive, capacitive, and even active elements. This configuration appears useful for directional averaging (to separate the stress and Hall effect, for example) and voltage integration in "geometrical" magnetoresistors. (b) An alternate wiring configuration where each current supply is identified with a unique boundary. (c) same as (a) except the elementary modifications occur on the exterior boundary. (d) An alternate source wiring configuration for (c). One might imagine a mixed configuration which includes features of the two alternate schemes.

FIG. 13) Some special quadruple injection schemes for realizing "short-circuited" off-diagonal-voltage resistors. (a) An injection scheme which tends to short-circuit the anti-symmetric off-diagonal voltage such as the Hall effect, while the symmetric component is unshorted. Here, the shorting occurs on the internal boundary. One might use the wiring scheme of FIG. 9(b) to realize this configurations. Although this embodiment includes only three shorts on the internal boundary, one may generalize it to an arbitrary number of shorts. In addition, as mentioned previously, the shorts may be replaced by electrical circuits including active and passive elements. (b) A second scheme which tends to short circuit the symmetric off-diagonal voltage such as, for example, the shear piezoresistive voltage in a semiconductor such as Silicon. (c) This configuration is analogous to (a) except that it is the Hall effect like signal on the exterior boundary that is electrically equilibrated, using a conductor/resistor. (d) The exterior boundary analog of (b). Voltages developed across any pairs of contacts may be utilized in applications.

FIG. 14) (a) Uniaxial eight-fold injection, with each current source identified with a unique boundary. Here, one may realize off-diagonal voltage integration of the contribution due to each supply. The currents may be set to obtain vanishing misalignment offset. (b) The configuration of (a) rotated by 90 degrees. (e) A biaxial sixteen-fold injection scheme may be realized by combining (a) and (b). This configuration gives better signal to offset. (c) An alternate (Corbino-like) wiring configuration of (a). (d) The configuration of (b) rotated by 90 degrees. (f) Configuration superposition of (b) and (d). This configuration may be made equivalent to (e) with a proper biasing of the currents. (g) and (h) are some other configuration superposition possibilities. Here, it is worth noting that the eight fold injection scheme of (a) and (c) could be generalized to an n-fold injection scheme, and the four fold rotationally symmetric square-shaped frame could be generalized to a m-fold rotationally symmetric frame, or an arbitrarily shaped doubly or multiply connected specimen.

FIG. 15) (a) A rectangular electrically conducting plate including several contacts (small shaded circles) is connected to two current sources, which serve to inject two orthogonally oriented currents. Off-diagonal voltages resulting, for example, from the application of a magnetic field or stress, may be measured utilizing appropriate pairs of free contacts. (b) a cross shaped conductor with orthogonal quadruple current injection. (c) An L shaped conductor with current and voltage contacts, with two orthogonally directed currents in spatially separate regions of the conductor. (d) An alternate wiring configuration. (e) Dual current injection in spatially separate regions of the conductor with a finite angle, $0<\upsilon<90$ degrees, between the direction of the two currents. (f) An alternate wiring configuration. The orientation marks may be used to align the sensor in Silicon, if necessary.

Figure 16C:
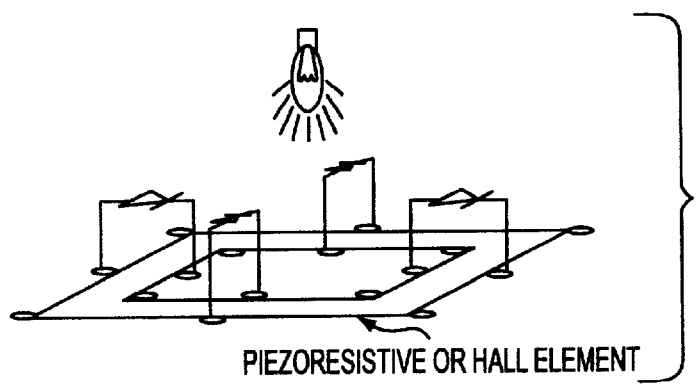

FIG. 16) In the devices shown in previous embodiments, it was frequently necessary to inject more than one current into the sample, sometimes using electrically separated current sources. (The electrical separation of the supplies helps realize configuration superposition). Although FIG. 1 shows some special embodiments of currents sources, it is clear that the design of the current source need not be restricted only to those shown in that figure. Indeed, any electrical circuit whose output may be modeled as a source can, for practical purposes, serve the function. We also point out the existence of a large number of variations in the design of the contacts, ranging from simple changes in the size, placement and composition, to more advanced contacts which need not be identifiable in a visual examination. Indeed, the number of contacts need not even be simply related to the number of wires bonded to sensor. Such complications could be built into the device especially when one integrates into the sensor, passive and active elements including amplifiers, transistors, diodes, resistors, capacitors, and inductors, for example. In some of the following figures, we identify some interesting aspects in using photovoltaic cells as a basis for photocurrent generators (sources). While we identify p-n junctions as a specific embodiment of the photocurrent generator, it could as well be any device which allows for photon-generated electron-hole pairs. The emphasis on this approach originates from the fact that semiconductors are frequently used in sensor applications involving the Hall effect and piezoresistive effect, and such systems may frequently be doped n-type or p-type to choose, among other things, the sign of the majority carrier. As the fabrication of p-n junctions is simple especially in mature (integrative) technologies such as Silicon, where the entanglement of the misalingment offset, the piezoresistive voltage, and the Hall effect is a problem that needs to be solved, we feel that such an approach merits attention because it could help with the problem of developing a simple current source. In (a), we illustrate the concept of the "light powered" Hall bar. It consists of a photocurrent generator (p-n junction) which connects electrically to the source and drain contacts of a Hall plate. This configuration may be viewed as a magneto-optic device because the light source, which may produce steady state or periodically varying photon flux upon the photovoltaic, modulates the current, while the magnetic field produces a Hall voltage across the voltage probes (small shaded (ohmic) contacts near the middle of the plate) which modulates by the product of the current times the magnetic field. Thus, such a device might find applications as magneto-optical frequency mixers. The photon source could be anything ranging from the Sun to a light bulb, candle, or a light emitting diode. There could also be other active and passive elements within the circuit to set the current to the desired range. The utility of this approach becomes more apparent in considering "the anti Hall bar within a Hall bar" configuration which might require dual current sources, see (b). Here, an analogous photovoltaic implementation using a pair of p-n junctions shows that a single light source could illuminate both diodes, which function as dual current generators. Indeed, upon orienting the current directions as shown, one could realize a Hall device with minimal misalignment offset. In (c), we have generalized this idea to a biaxial quadruple current configuration, where a single light source illuminates a quartet of diodes (photocurrent generators). Once again, active and passive elements necessary to set the currents have not been shown. It is also worth pointing out that it is not necessary that the same source illuminate all the photo current generators.

FIG. 17) In this figure, we illustrate the concept of integrating a single photocurrent generator into the Hall or piezoresistive element. (a) This is the essential equivalent circuit. (b) A special embodiment of the integrated photocurrent generator-Hall device. A buried n- type channel constitutes the electrically conductive material where the off-diagonal component (Hall effect or piezoresistive voltage) is to be measured. On the right side of the device, there is a standard contact consisting of $n^+$ material followed, on top, by metallization which makes up the wire. On the left side of the device (drain), the current contact is actually a p-n junction where the p-type material lies atop the n-channel. The incidence of photons upon this p-n junction creates electron (−) hole (+) pairs. A contact is made to the p-type material with $p^+$ material, and metallization (wire) connects to the p type contact. The main idea here is that one contact of the Hall plate becomes a photovoltaic and the metallization serves as the conduit for closing the circuit. (c) The p-n junction is relatively close to the top of the device. Thus topside illumination generates a photocurrent which flows within the device as shown (cross section (along the center of the device from one current contact to the other)), the existence of a current in the Hall element makes possible an "off-diagonal" voltage due to the application of a magnetic field or stress upon the element. The top view shows another perspective of the current flow within the device. Here, one sees that the metallization (wire) may be as thin as practicable or as wide as desired, and that it serves to collect the current from the drain and return it to the source. Of course, in such a device, one need not observe any external leads attached to the source/drain regions, although one may readily identify that it operates on the same principle shown in (a). One might also imagine a large number of simple modifications to the illustrated implementation: (i) The return wire might be a strip of n or p material connecting the source and drain, (ii) The buried n-channel may moved adjacent to the surface, (iii) there might be insulating layers to increase electrical isolation and protect the device, (iv) the p-n junction might be some distance away from the Hall element and it might not be integrated into one of the current contacts, (v) the p-n junction may be formed by placing the p and n regions adjacent to each other instead of atop each other, (vi) illumination may come from the sides or the bottom of the device, (vii) the doping profiles may be as appropriate to the application, (viii) one might also choose to work with p channels instead of n-channels and design appropriately. Indeed, any Hall or piezoresistive element which includes a photovoltaic or photocurrent generator falls within the scope of this invention. In Silicon, one may orient this device to minimize or maximize the shear piezoresistive effect (FIG. 3)

FIG. 18) (a) the photon powered four terminal electrical plate. (b) A schematic of a back-side p-n junction connected by wires or wireholes to the topside electrical plate. This implementation is useful for preventing light from impinging on the conducting channel where the (off-diagonal) Hall or piezoresistive voltages are generated. It also helps makes more efficient use of the semiconductor surface while increasing the area and current generating capacity of the photocurrent generator. Note that current limiting resistors have not been shown although they may be simply integrated into the design. (c) A top side inspection of the electrical plate shows that there are "no current contacts" although a current appears at the source and vanishes into the drain.

FIG. 19) (a) A frame shaped (doubly connected) anti Hall bar within a Hall bar or Hall bar with a hole, which includes integrated current generators within the current contacts. This configuration exhibits, from left to right, source on the outer boundary, drain on the inner boundary, source on the inner boundary, and drain on the outer boundary. The shaded region at the top corresponds to the conducting Hall channel. Hall voltages may be measured on the exterior as well as the interior boundary. (b) a cross section shows backside p-n junction which make up an "outside to inside" current circuit on the left and right sides of the crossection. The two circuits need not generate the same current under illumination and circuit parameters may be adjusted to obtain the desired current. The shaded vertical columns constitute a conducting ohmic contact which allows the current to reach the top side Hall plate. (c) A schematic of a doping profile. It is worth reiterating that it is not necessary that the two photocurrent generators lie directly below the Hall plate or even on the back side. They might also be placed at a distance from the Hall element on the topside or even within the interior hole. The device may be oriented as shown in FIG. 4, in order to obtain either the low piezo, or the high piezo, characteristics.

FIG. 20) (a) this implementation is analogous to that shown in the previous figure except that the configuration exhibits, from left to right, source on outer boundary, drain on inner boundary, drain on inner boundary, source on outer boundary. This current biasing configuration is useful for magnetic field gradient sensing. (b) and (c) same as previous figure except that profiles have been changed to produce the desired current biasing configuration. Here, it is also worth noting that the current loops need not connect the outer and inner boundary. One might similarly associate the source and drain of each photocurrent generator with a unique boundary, as in FIG. 4(c). One may also orient the device on Silicon, if desired.

FIG. 21) (a) a four-fold rotationally-symmetric biaxial, quadruple current injected Hall or piezoresistive device, using four integrated photocurrent generators. In the source region, the dark point identifies the arrow head of the current vector, while the cross in the drain contact signifies the tail of the current vector arrow. The (black) contacts along the diagonals of the square serve to measure the off-diagonal voltages, both on the interior and exterior boundaries. The Hall channel is shaded, as shown. The dotted line marks the axis of the cross section. The configuration exhibits, from left to right, source on outer boundary, drain on inner boundary, source on inner boundary, and drain on outer boundary. In addition, from top to bottom, one observes in cross section, source on outer boundary, drain on inner boundary, source on inner boundary, and drain on outer boundary. However, one need not observe any bonded wires on these contacts in a visual inspection. (b) the conducting current paths in a cross section may be identical to that shown earlier. (c) a possible doping profile. To the schematic shown in (a) one may include additional cross sections parallel to the indicated cross sections, such that one realizes several source-drain pairs on each arm of the structure. For each additional source drain pair, there could be a photocell on the device which serves as a current generator. All the photocurrent generators may be powered by a single light source such as a light emitting diode. Then, one obtains a Hall or piezoresistive element which could have, at the minimum, one pair of wires for reading the desired off-diagonal voltage and one pair of leads for supplying the current to the light source. Due to the resultant simplification in the packaging, one sees immediately that integrating current sources on the sensor is especially advantageous. Finally, one could, just as easily, exchange the positions of the current and voltage contacts, or use some other convenient doubly connected shape to realize an advanced Hall or piezoresistive sensor.

What is claimed is:

1. Device for measuring magnetic Hall voltages, shear piezoresistive voltages, and other off-diagonal voltages, the device comprising voltage and current sources:

a planar element for injecting one or more currents from said current sources or applying one or more voltages from said voltage sources therein, the planar element including:

up to n electrically insulating regions made by holes associated with up to n+1 boundaries with first contact pairs for measuring said voltages located at the boundaries, the first contact pairs being located on a number of first axes, n being<1 and second contact pairs for passing a current or applying a voltage difference, the second contact pairs being located on a number of second axes, wherein the second axes are arranged with a finite angle $\theta$, $0 \leq \theta \leq 360°$ with respect to the first axes, the second axes being arranged with respect to the crystallographic orientation of the planar semiconductor element such that one or more currents are made to flow along particular crystallographic orientations in order to select a particular piezoresistive response in the element.

2. Device according to claim 1, wherein further at least two of the first axes are at a finite angle $\Theta$, including the special cases $\Theta=45°$ and $\Theta=90°$, with respect to each other.

3. Device according to claim 1, wherein further the Hall and piezoresistive voltages are separated onto different first contact pairs.

4. Device according to claim 1, wherein further the element is a rotationally- or an axially- symmetric structure.

5. Device according to claim 1, wherein further at least two of the second axes are at a finite angle $\Theta$, including the special cases $\Theta=45°$ and $\Theta=90°$, with respect to each other.

6. Device according to claim 1, wherein further said element is composed of a single- or multi-layered, homo- or hetero-semiconductor structure on a semiconducting or insulating substrate, in particular one that includes one or more electrically conducting layers of Silicon, Germanium, or Silicon-Germanium.

7. Device according to claim 6 wherein further said element includes an n- or p-doped semiconductor layer and an oppositely doped (p- or n- respectively) substrate.

8. Device according to claim 1, characterized in that the device further includes a number of current generators and/or voltage sources for providing the currents and/or generating the voltages, respectively.

9. Device according to claim 8, wherein further p-n functions constitute the sources in the current- or voltage-generating circuits, and there exists at least one light source for driving the p-n functions as photovoltaic cells.

10. Method for simultaneously measuring off-diagonal voltages by using the device of claim 1, characterized by the generation of a number of currents or voltages and injecting the currents or applying the voltages. respectively, to the planar element through the second contact pairs, and measuring said voltages with the first contact pairs.

11. Method according to claim 10, characterized by the separation of symmetric and asymmetric components of the off-diagonal voltages onto different first contact pairs.

12. Method according to claim 10, characterized by the separation of magnetic Hall voltages and shear piezoresistive voltages onto different first contact pairs.

13. Method according to claim 10, characterized by the dimensioning of current(s) and applied voltage(s) such that current density vanishes proximately to one or more first contact pairs, thereby compensating for misalignments of said first contacts.

14. Method according to claim 10, characterized by the application of currents or voltages across contact pairs, such that first contact pairs that exhibit a voltage in response to an applied magnetic field or shear stress exhibit a vanishing offset voltage in the absence of said applied magnetic field or shear stress.

15. Method according to claim 10, characterized by the generation of currents and voltage differences with sources integrated with the sensor element on one and the same substrate.

16. Method according to claim 10, characterized by generating the currents by use of photovoltaic cells, in particular p-n junctions integrating with the sensor element on one and the same insulating or semiconducting substrate.

17. Method according to claim 11, characterized by the separation of magnetic Hall voltages and shear piezoresistive voltages onto different first contact pairs.

18. Device according to claim 9 wherein further said p-n junctions are integrated with the sensor element on one and the same substrate.

19. Method of claim 10, wherein further a symmetric off-diagonal voltage is the shear piezoresistive voltage, and an asymmetric off-diagonal voltage is the magnetic Hall voltage.

20. Method for measuring off-diagonal voltages using the device of claim 1, characterized by the passing of current and the application of voltage differences using second contact pairs that lie at the internal periphery of an electrically insulating region, and measuring said voltages with first contact pairs.

21. Method for realizing off-diagonal voltages using the device of claim 1, characterized by the measurement of said voltages using first contact pairs that lie at the internal periphery of an electrically insulating region, and the passing of current and application voltage differences using second contact pairs.

22. Method for engineering the current distribution within the device of claim 1, characterized by the passing of current and application of voltage differences from separated electrical sources using second contact pairs.

23. Method for setting the boundary conditions in the device of claim 1, characterized by the passing of current and the application of voltage differences from separated electrical sources using second contact pairs.

* * * * *

UNITED STATES PATENT AND TRADEMARK OFFICE
CERTIFICATE OF CORRECTION

PATENT NO : 6,008,643
DATED      : DECEMBER 28, 1999
INVENTOR(S): RAMESH G. MANI, et al.

It is certified that error appears in the above-identified patent and that said Letters Patent is hereby corrected as shown below:

On the title page,

Item [75] should be corrected to read as follows:

Klaus von Klitzing

Item [30] should be corrected to read as follows:

September 29, 1994

Signed and Sealed this

Twenty-eighth Day of November, 2000

Attest:

Q. TODD DICKINSON

*Attesting Officer*     *Director of Patents and Trademarks*